United States Patent
Saito et al.

(10) Patent No.: US 10,879,314 B2
(45) Date of Patent: Dec. 29, 2020

(54) PHOTOELECTRIC CONVERSION ELEMENT, IMAGING DEVICE, AND ELECTRONIC APPARATUS

(71) Applicant: SONY SEMICONDUCTOR SOLUTIONS CORPORATION, Kanagawa (JP)

(72) Inventors: Yosuke Saito, Tokyo (JP); Yoshiaki Obana, Kanagawa (JP); Nobuyuki Matsuzawa, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/751,029

(22) PCT Filed: Aug. 9, 2016

(86) PCT No.: PCT/JP2016/073416
§ 371 (c)(1),
(2) Date: Feb. 7, 2018

(87) PCT Pub. No.: WO2017/033736
PCT Pub. Date: Mar. 2, 2017

(65) Prior Publication Data
US 2018/0233540 A1 Aug. 16, 2018

(30) Foreign Application Priority Data
Aug. 27, 2015 (JP) .................................. 2015-168322

(51) Int. Cl.
*H01L 27/30* (2006.01)
*H01L 27/146* (2006.01)
(Continued)

(52) U.S. Cl.
CPC ...... *H01L 27/307* (2013.01); *H01L 27/14647* (2013.01); *H01L 27/14665* (2013.01);
(Continued)

(58) Field of Classification Search
CPC ............. H01L 27/307; H01L 27/14647; H01L 27/1461; H01L 27/14665; H01L 27/14667;
(Continued)

(56) References Cited

U.S. PATENT DOCUMENTS

2006/0278869 A1* 12/2006 Hioki ................ H01L 27/14647
257/40
2008/0198213 A1* 8/2008 Nakazawa ............. C08G 77/60
347/100
(Continued)

FOREIGN PATENT DOCUMENTS

CN 101964352 A 2/2011
JP 2001-053355 A 2/2001
(Continued)

OTHER PUBLICATIONS

Kim, et al., "Optoelectronic and Charge Transport Properties at Organic-Organic Semiconductor Interfaces: Comparison between Polyfluorene-Based Polymer Blend and Copolymer", American Chemical Society, 2008, vol. 130, No. 39, pp. 13120-13131.
(Continued)

*Primary Examiner* — Christine A Enad
(74) *Attorney, Agent, or Firm* — Chip Law Group

(57) ABSTRACT

A photoelectric conversion element according to one embodiment of the disclosure includes: a first electrode and a second electrode that are oppositely disposed; and a photoelectric conversion layer that is provided between the first electrode and the second electrode, and includes a high-molecular semiconductor material and a low-molecular
(Continued)

material. The high-molecular semiconductor material has an absorption coefficient in a visible light region of 50000 cm$^{-1}$ or less. The low-molecular material includes an absorption peak in a wavelength range corresponding to one color in the visible light region.

12 Claims, 12 Drawing Sheets

(51) Int. Cl.
| | |
|---|---|
| *H01L 27/28* | (2006.01) |
| *H01L 51/00* | (2006.01) |
| *H01L 51/42* | (2006.01) |
| *H01L 51/44* | (2006.01) |
| *H04N 5/369* | (2011.01) |

(52) U.S. Cl.
CPC .......... *H01L 27/286* (2013.01); *H01L 51/006* (2013.01); *H01L 51/008* (2013.01); *H01L 51/0039* (2013.01); *H01L 51/0047* (2013.01); *H01L 51/0068* (2013.01); *H01L 51/0072* (2013.01); *H01L 51/42* (2013.01); *H01L 51/4253* (2013.01); *H01L 51/442* (2013.01); *H04N 5/369* (2013.01); *H01L 27/1461* (2013.01); *H01L 51/0058* (2013.01); *Y02E 10/549* (2013.01)

(58) Field of Classification Search
CPC .............. H01L 27/286; H01L 51/0039; H01L 51/0047; H01L 51/006; H01L 51/0068; H01L 51/0072; H01L 51/008; H01L 51/42; H01L 51/4253; H01L 51/442
See application file for complete search history.

(56) References Cited

U.S. PATENT DOCUMENTS

| | | | | |
|---|---|---|---|---|
| 2009/0038676 | A1* | 2/2009 | Monden | H01G 9/204 |
| | | | | 136/252 |
| 2009/0056811 | A1* | 3/2009 | Noguchi | C08G 61/02 |
| | | | | 136/263 |
| 2009/0184235 | A1* | 7/2009 | Nomura | C09B 23/105 |
| | | | | 250/206 |
| 2009/0302748 | A1* | 12/2009 | Nakatani | C08G 61/02 |
| | | | | 313/504 |
| 2010/0288339 | A1* | 11/2010 | Noguchi | C08G 61/02 |
| | | | | 136/252 |
| 2011/0019042 | A1* | 1/2011 | Yamaguchi | H01L 27/14632 |
| | | | | 348/280 |
| 2011/0036406 | A1 | 2/2011 | Okubo | |
| 2012/0043529 | A1* | 2/2012 | Uetani | B82Y 10/00 |
| | | | | 257/40 |
| 2014/0231781 | A1* | 8/2014 | Imai | H01L 51/448 |
| | | | | 257/40 |
| 2015/0325803 | A1* | 11/2015 | Lee | H01L 51/442 |
| | | | | 257/40 |
| 2016/0013426 | A1* | 1/2016 | Yoshioka | C07D 493/04 |
| | | | | 250/206 |
| 2016/0149144 | A1* | 5/2016 | Yamamoto | H01L 51/0053 |
| | | | | 257/40 |
| 2017/0062746 | A1* | 3/2017 | Sawaki | H01L 31/10 |

FOREIGN PATENT DOCUMENTS

| | | |
|---|---|---|
| JP | 2003-234460 A | 8/2003 |
| JP | 2005-303266 A | 10/2005 |
| JP | 2006-093691 A | 4/2006 |
| JP | 2006-339424 A | 12/2006 |
| JP | 2007-059483 A | 3/2007 |
| JP | 2011-029337 A | 2/2011 |
| JP | 2011-124469 A | 6/2011 |
| JP | 5566890 B2 | 8/2014 |
| KR | 10-2011-0010058 A | 1/2011 |
| TW | 201130120 A | 9/2011 |
| WO | 2010/021374 A1 | 2/2010 |
| WO | 2013/065621 A1 | 5/2013 |

OTHER PUBLICATIONS

International Search Report and Written Opinion of PCT Application No. PCT/JP2016/073416, dated Sep. 13, 2016, 10 pages.

Kim, et al., "Optoelectronic and Charge Transport Properties at Organic-Organic Semiconductor Interfaces: Comparison between Polyfluorene-Based Polymer Blend and Copolymer", American Chemical Society, Sep. 4, 2008, vol. 130, No. 39, pp. 13120-13131.

* cited by examiner

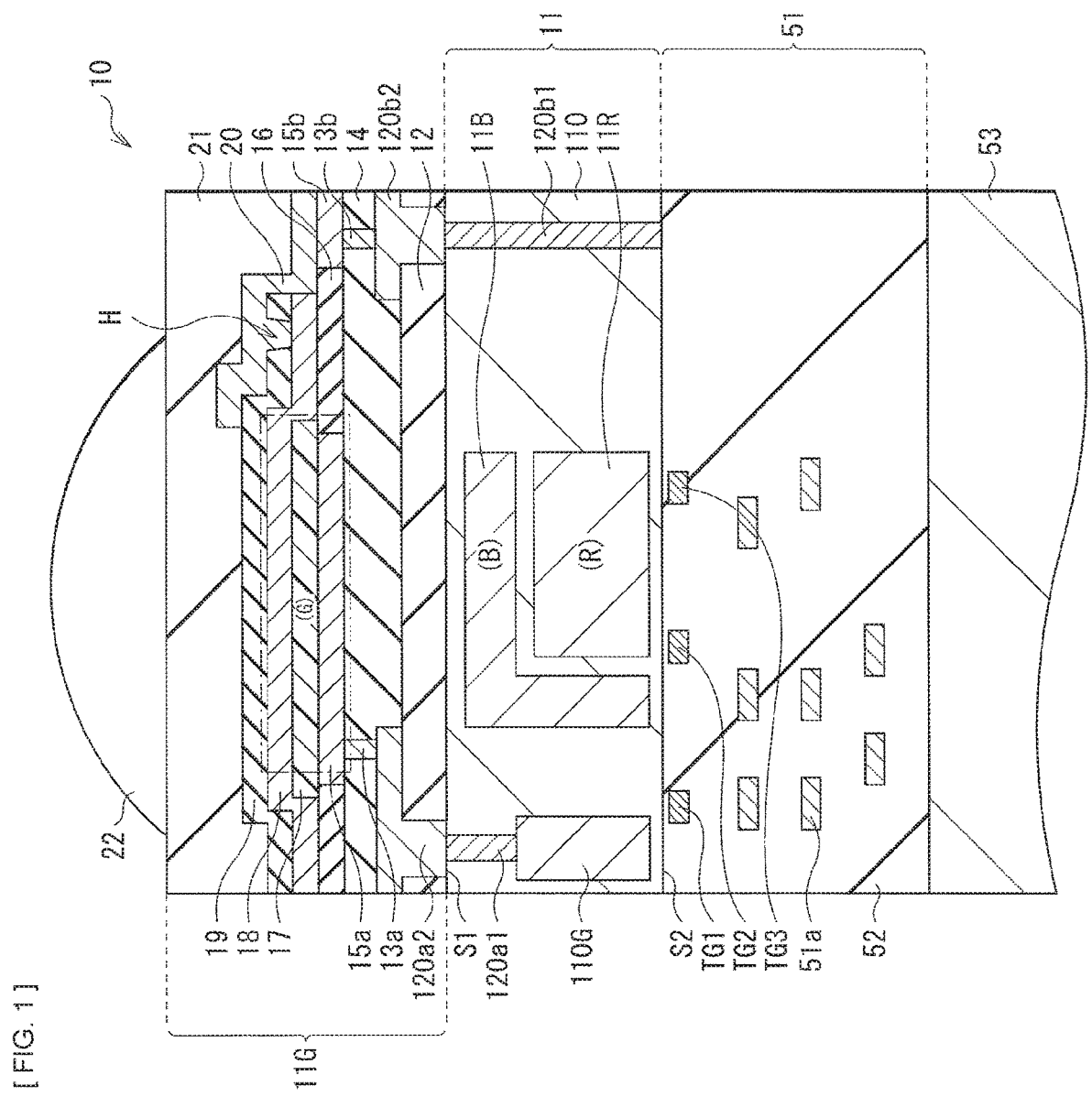
[FIG. 1]

[ FIG. 2 ]
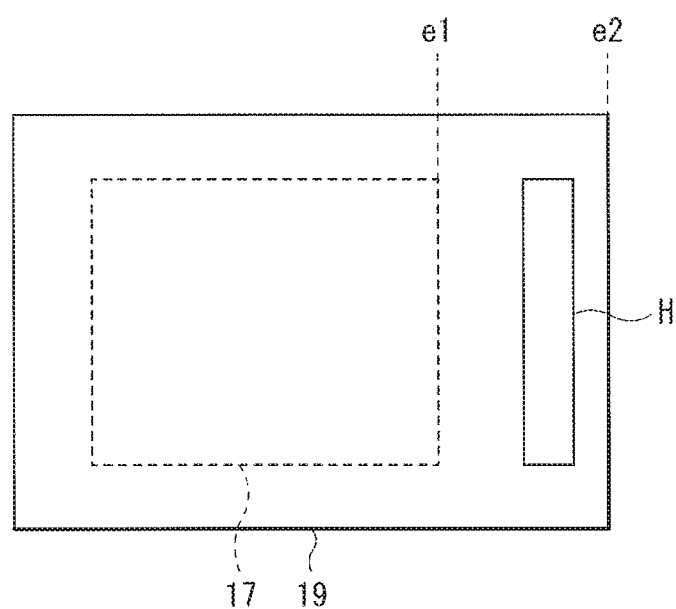

[ FIG. 3A ]
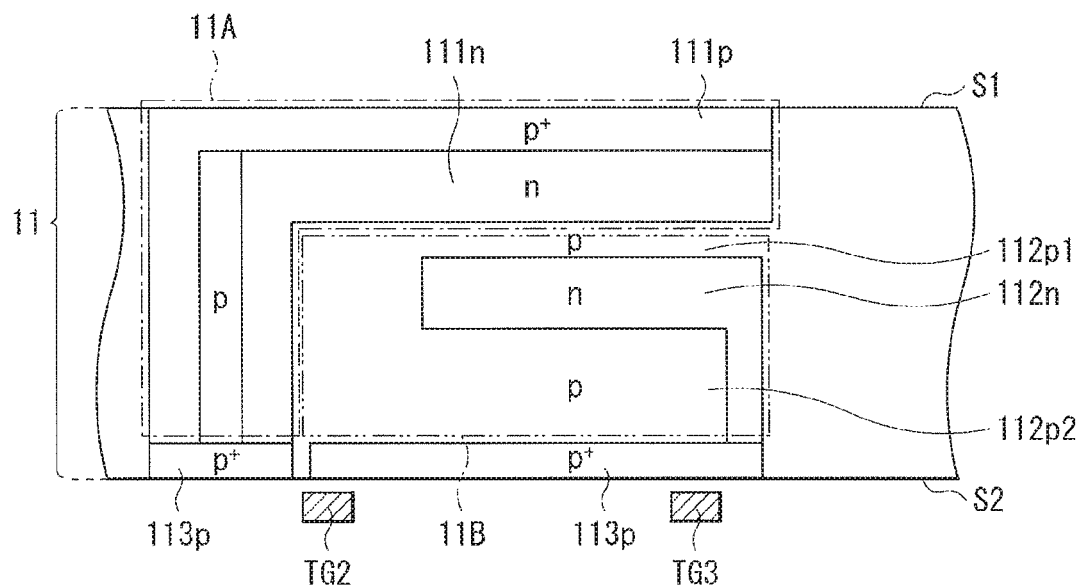
[ FIG. 3B ]
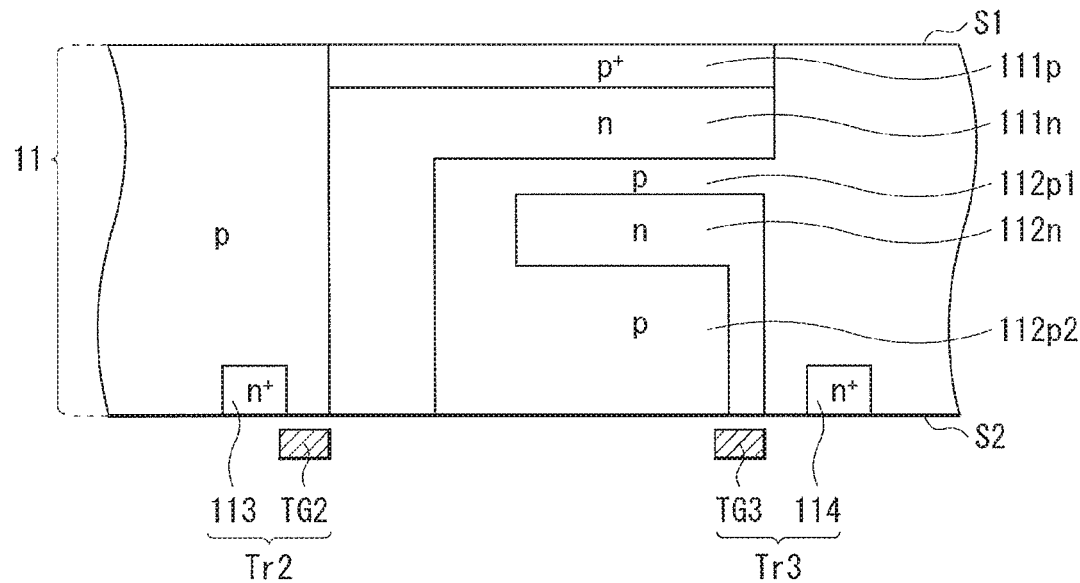

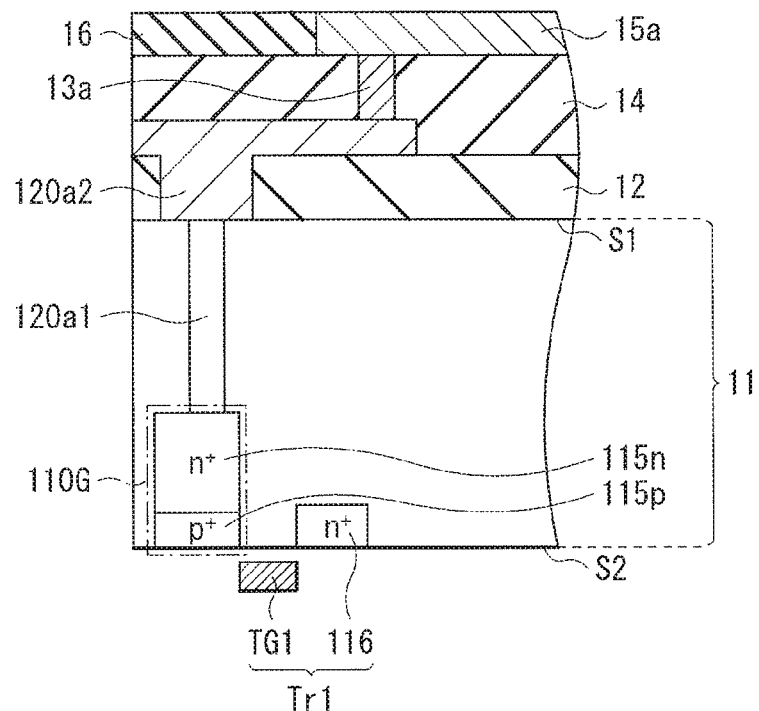
[FIG. 4]

[ FIG. 5A ]
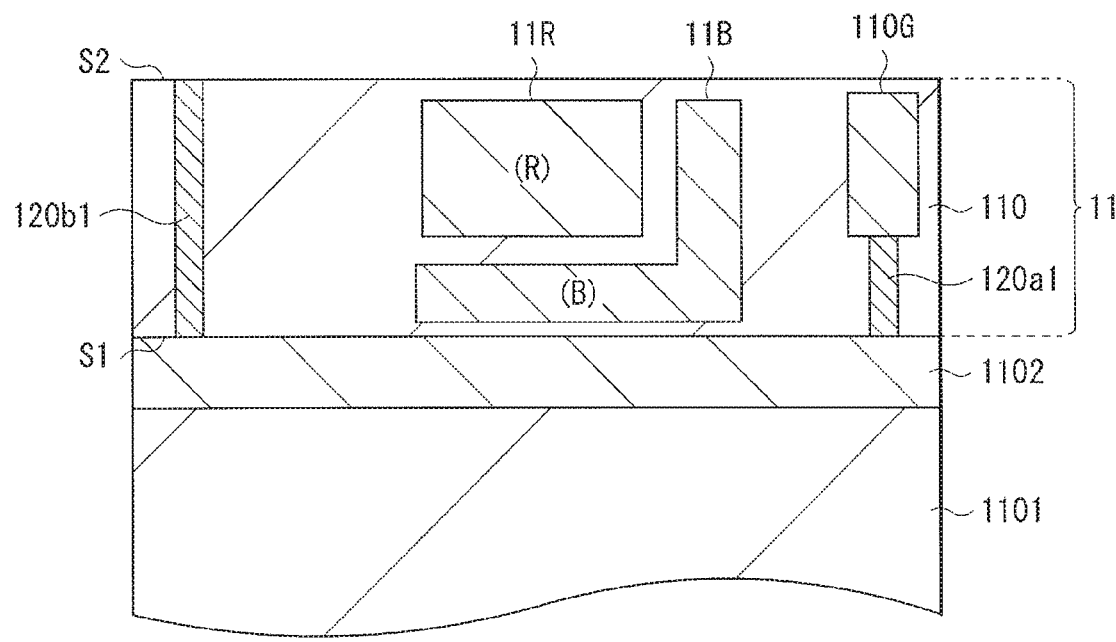
[ FIG. 5B ]
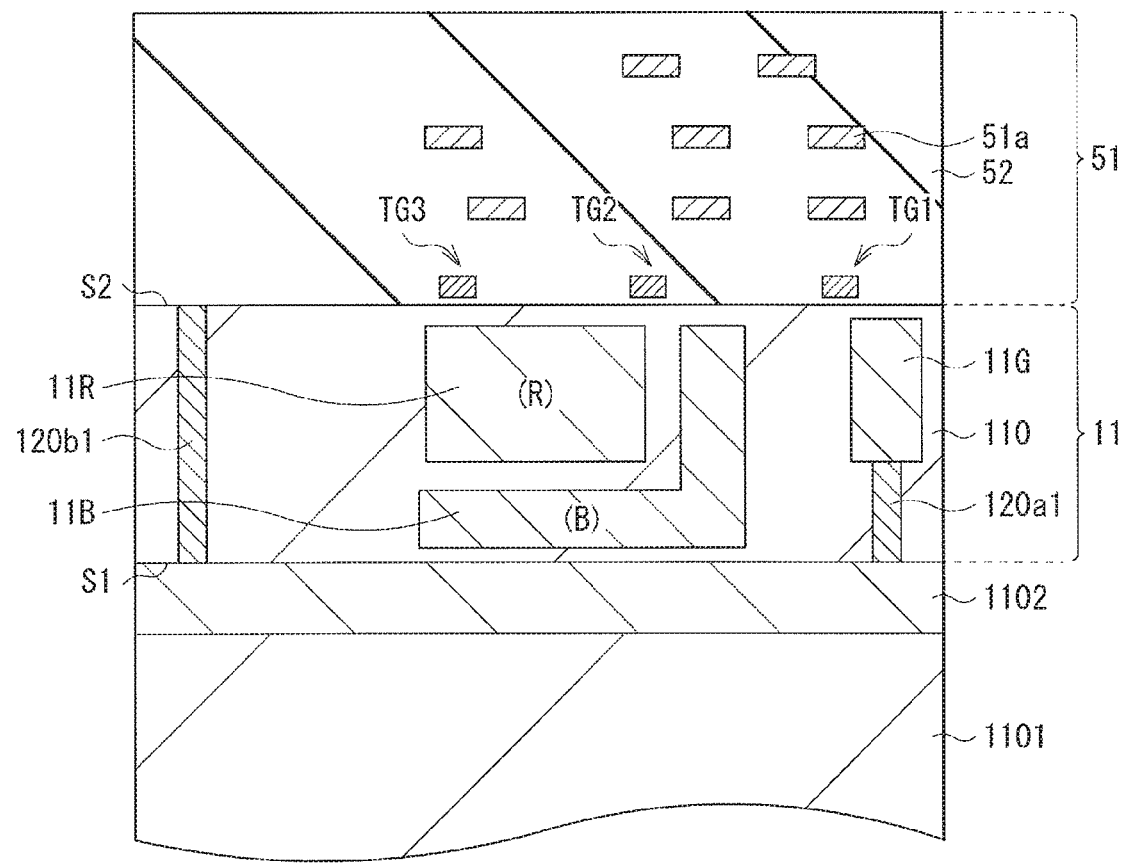

[FIG. 6A]
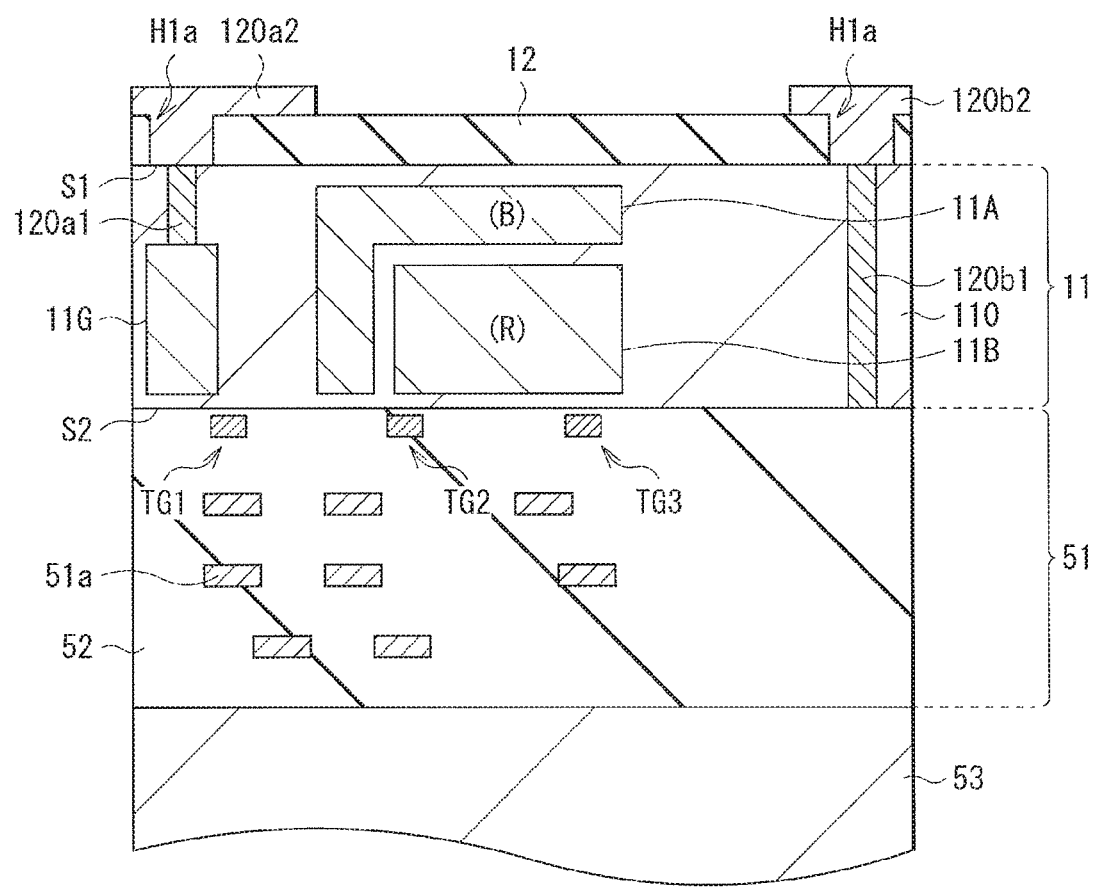

[FIG. 6B]
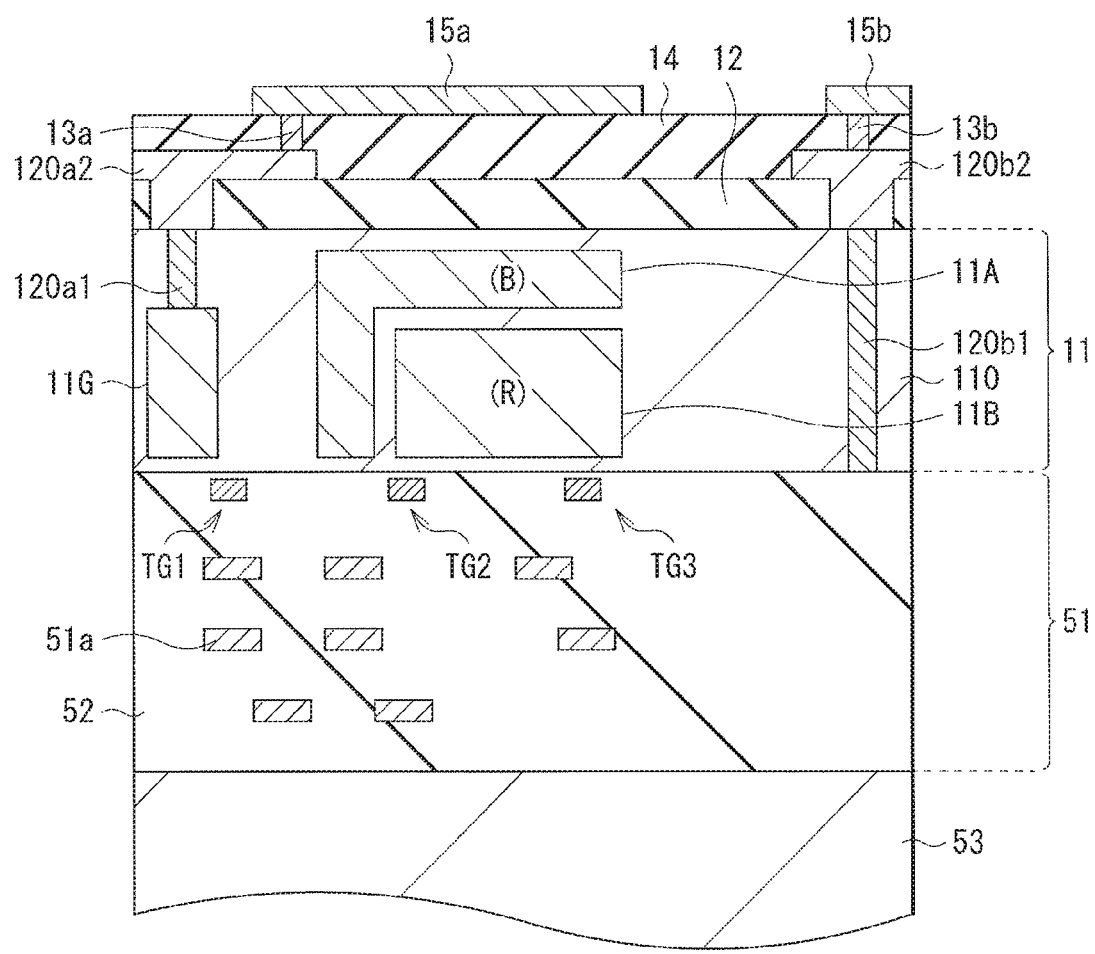

[ FIG. 7A ]
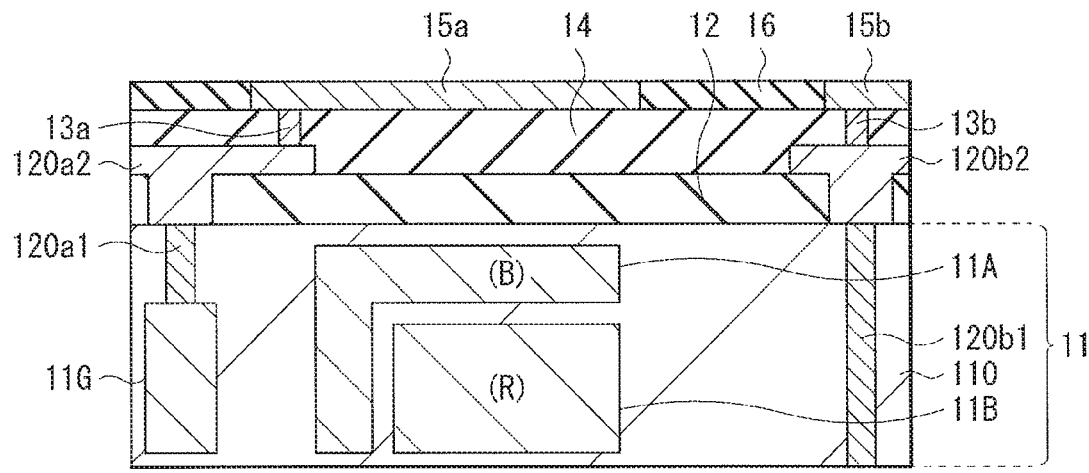
[ FIG. 7B ]
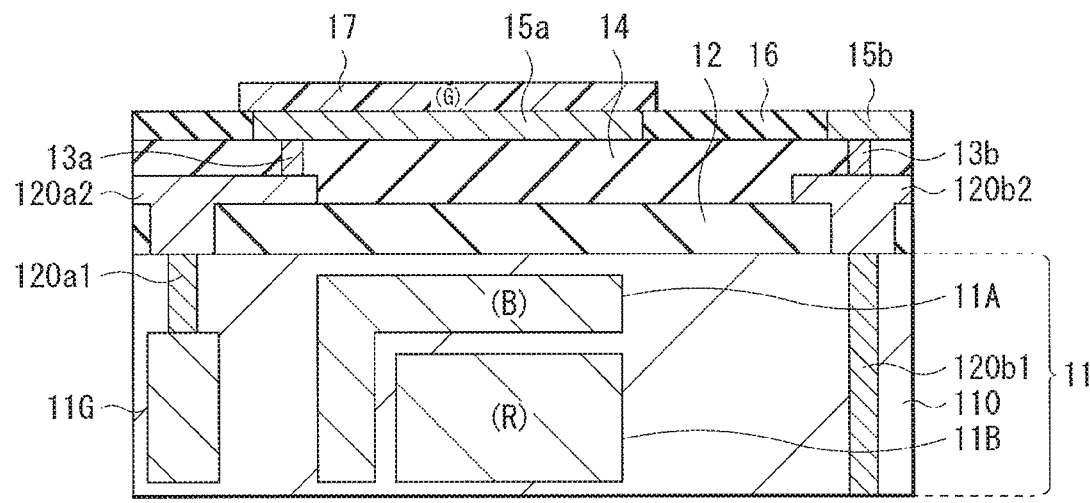
[ FIG. 7C ]
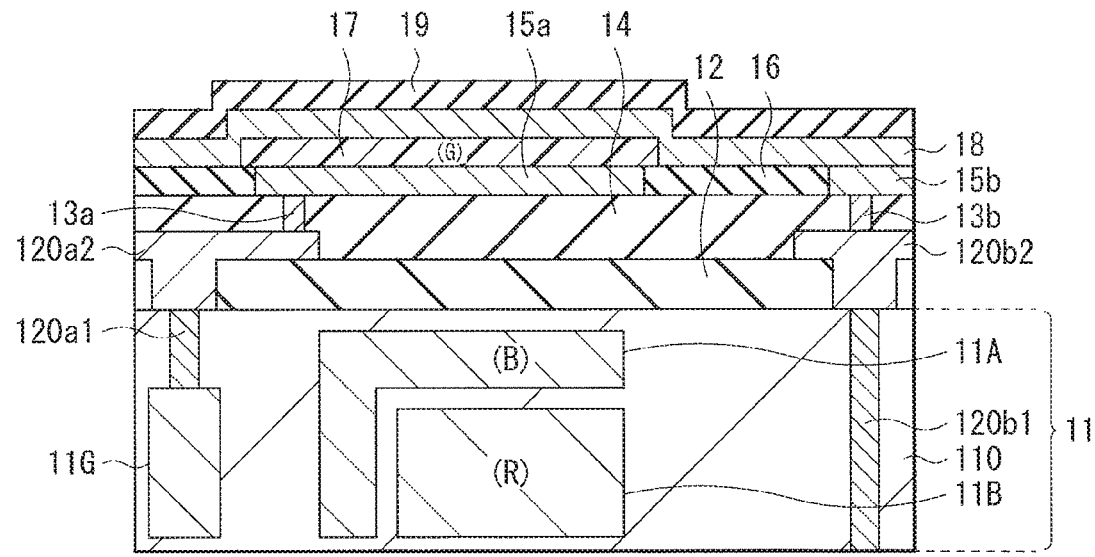

[FIG. 8]
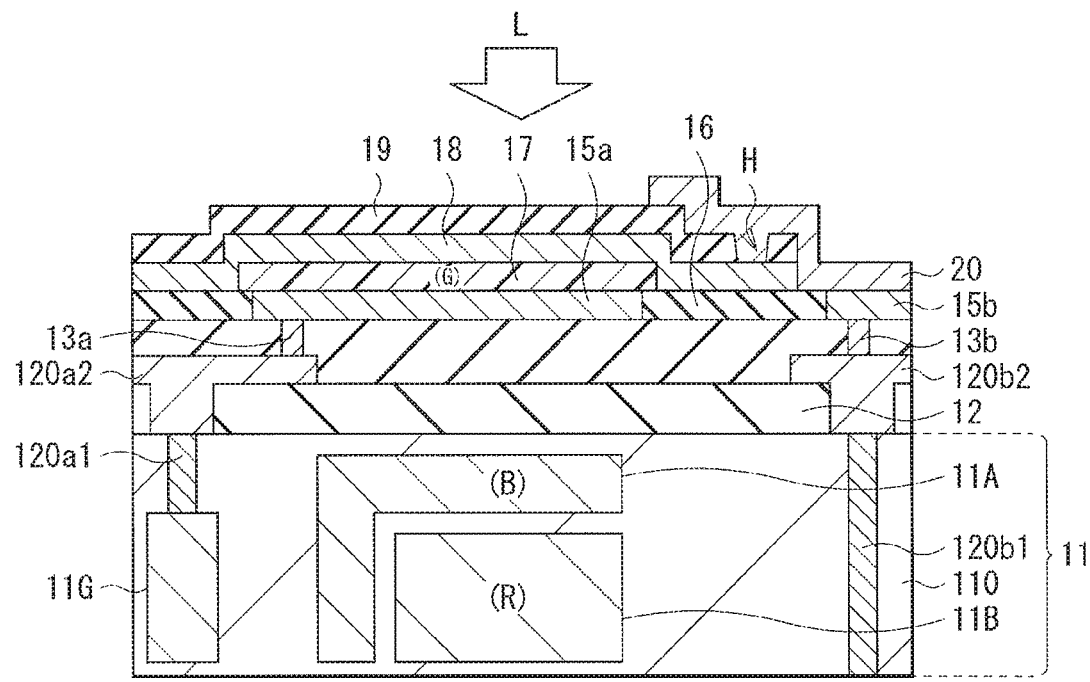
[FIG. 9]
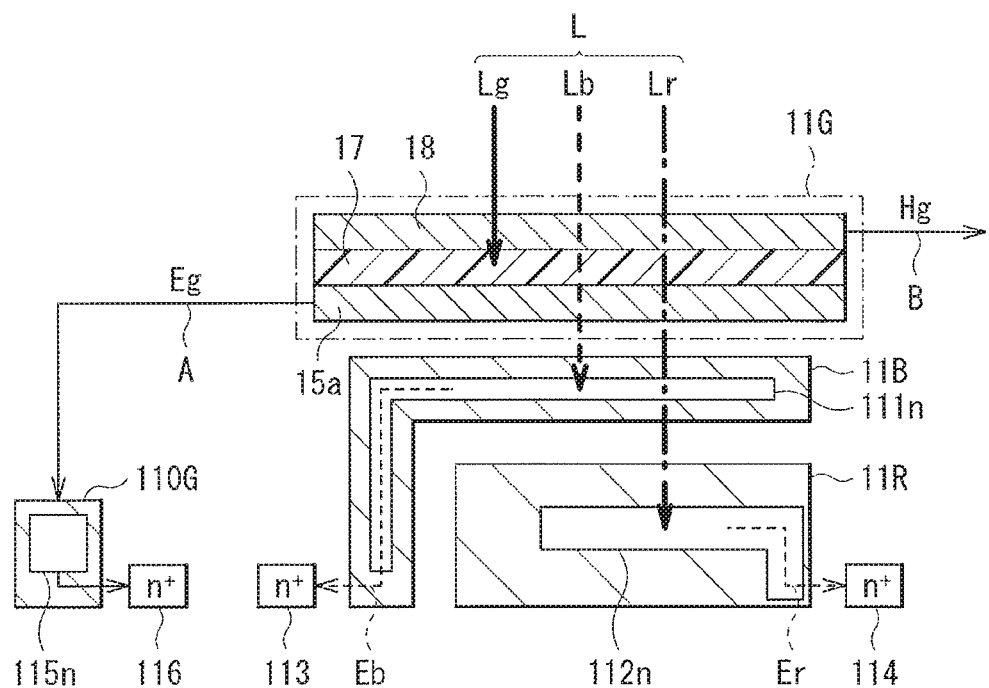

[ FIG. 10 ]
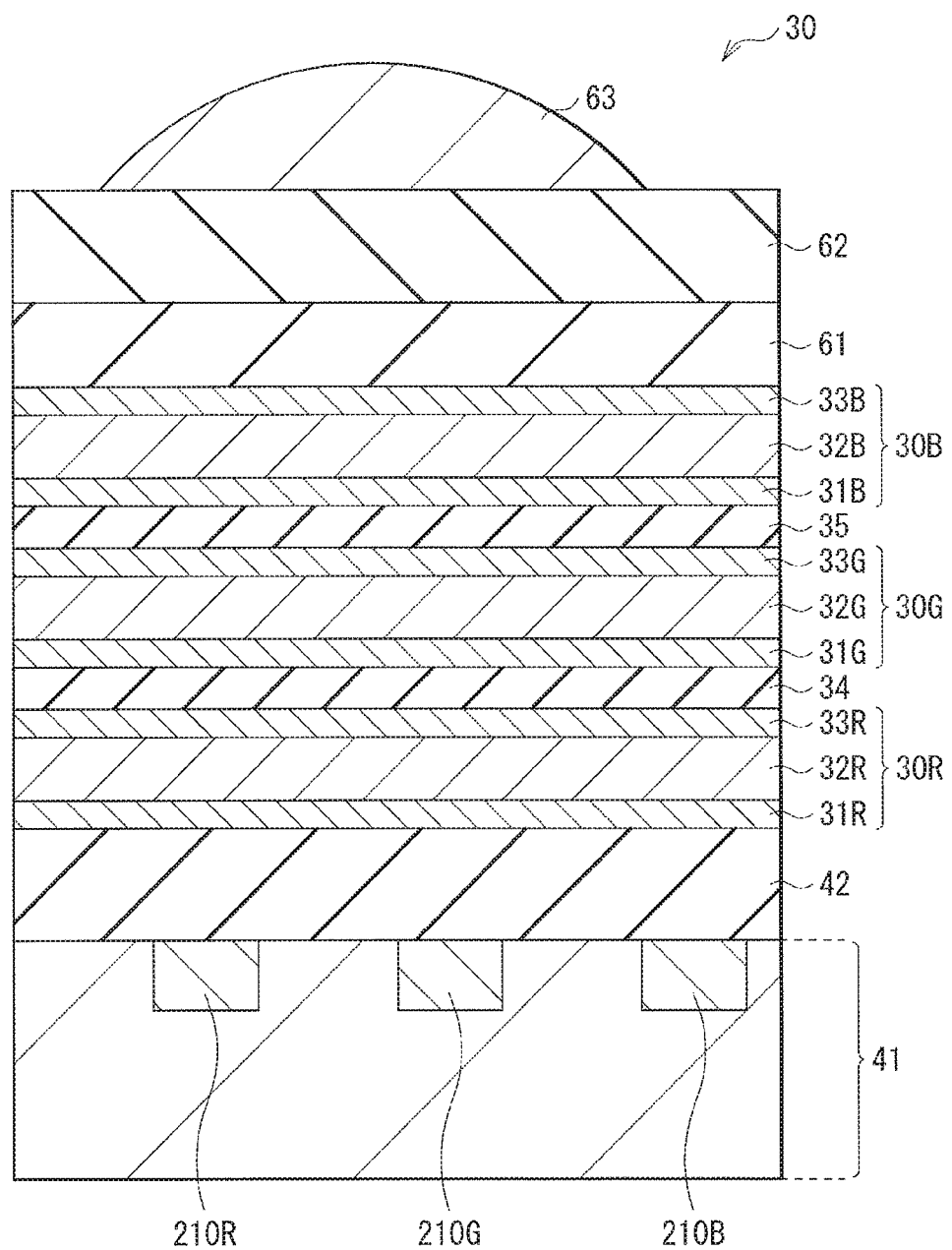

[ FIG. 11 ]
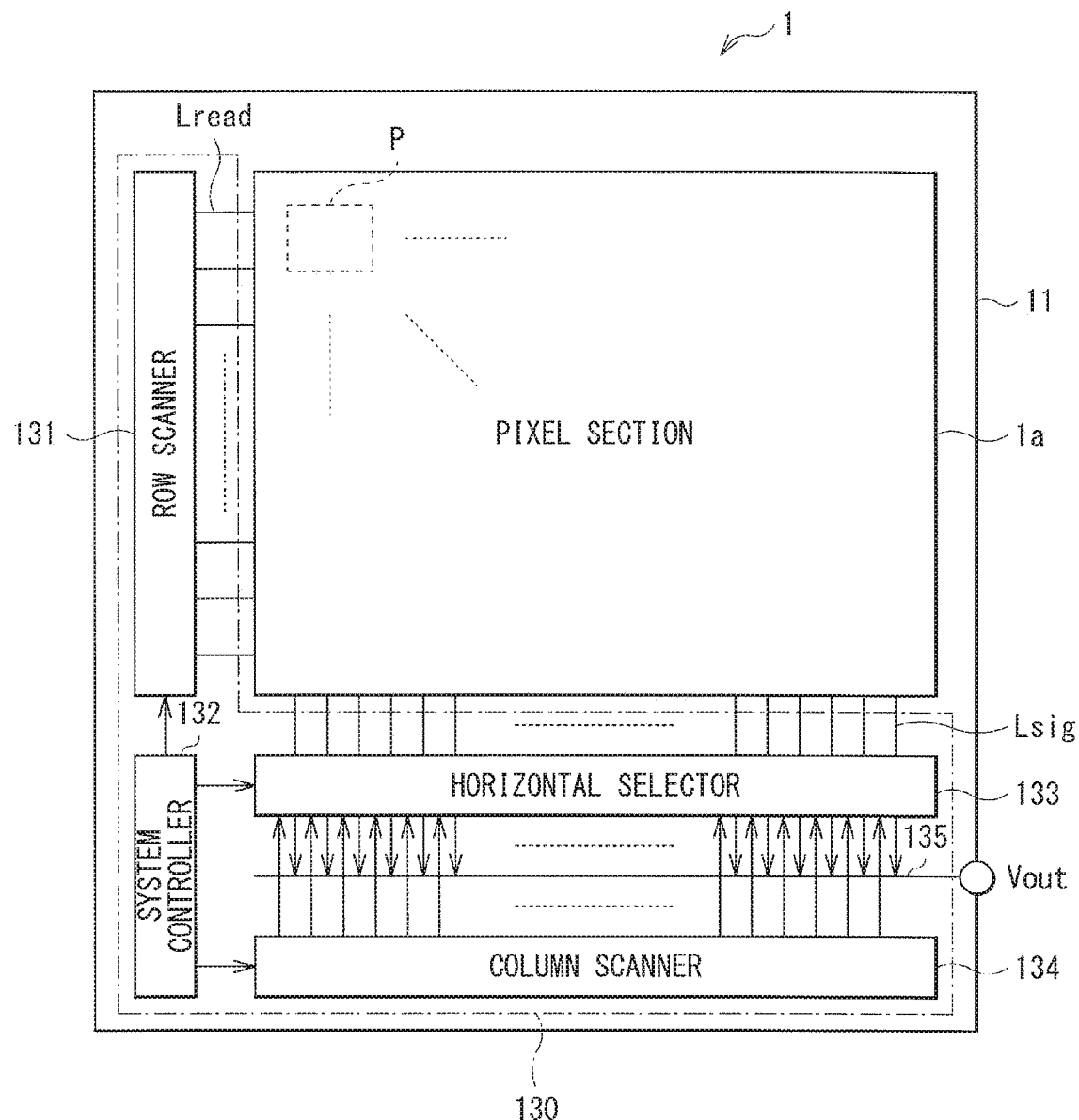

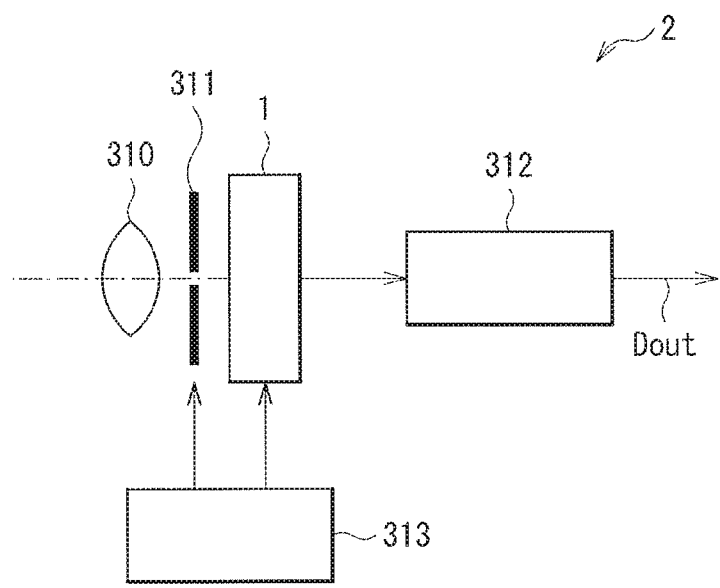
[ FIG. 12 ]

PHOTOELECTRIC CONVERSION ELEMENT, IMAGING DEVICE, AND ELECTRONIC APPARATUS

CROSS REFERENCE TO RELATED APPLICATIONS

This application is a U.S. National Phase of International Patent Application No. PCT/JP2016/073416 filed on Aug. 9, 2016, which claims priority benefit of Japanese Patent Application No. JP 2015-168322 filed in the Japan Patent Office on Aug. 27, 2015. Each of the above-referenced applications is hereby incorporated herein by reference in its entirety.

TECHNICAL FIELD

The disclosure relates to, for example, a photoelectric conversion element using an organic semiconductor, and to an imaging device and an electronic apparatus each including the photoelectric conversion element.

BACKGROUND ART

In recent years, reduction of a pixel size is progressing in a solid-state imaging unit such as a CCD (Charge Coupled Device) image sensor and a CMOS (Complementary Metal Oxide Semiconductor) image sensor. Therefore, the number of photons entering a unit pixel is decreased, which deteriorates sensitivity and an S/N ratio. In addition, in a case where a color filter in which filters of primary colors of red, green, and blue are two-dimensionally arranged is used for coloration, sensitivity is deteriorated in a red pixel because green light and blue light are absorbed by the color filter. Further, interpolation processing is performed between the pixels in generation of signals of the respective colors, which causes a so-called false color.

Accordingly, for example, PTL 1 discloses an image sensor that uses an organic photoelectric conversion film having a multilayer structure in which an organic photoelectric conversion film having sensitivity to blue light (B), an organic photoelectric conversion film having sensitivity to green light (G), and an organic photoelectric conversion film having sensitivity to red light (R) are sequentially stacked. In the image sensor, signals of B/G/R are separately extracted from one pixel to improve sensitivity. PTL 2 discloses an imaging device in which an organic photoelectric conversion film of a single layer is provided, a signal of one color is extracted by the organic photoelectric conversion film, and signals of two colors are extracted through silicon (Si) bulk spectroscopy.

Further, various studies have been performed in order to improve device characteristics of the photoelectric conversion element such as photoelectric conversion efficiency and durability. In NPTL 1, a mixed film using two kinds of high-molecular materials has been formed, and a report relating to electroluminescent characteristics, photoelectric conversion efficiency, and charge transport characteristics, of copolymer has been made.

CITATION LIST

Patent Literature

PTL 1: Japanese Unexamined Patent Application Publication No. 2003-234460

PTL 2: Japanese Unexamined Patent Application Publication No. 2005-303266

Non-Patent Literature

NPTL 1: J. AmericanChemical Society 2008, 130, 13120. Kim et. al

SUMMARY OF INVENTION

In the imaging device disclosed in PTL 2, most of the entering light is photoelectrically converted and read out, and use efficiency of visible light is close to 100%. Further, it is possible to generate an image with high sensitivity and high resolution (inconspicuous in false color) because color signals of three colors of R, G, and B are obtainable by respective light receivers. Accordingly, excellent wavelength selectivity is demanded for such a multilayer imaging device, and improvement of high response time (high responsiveness) necessary for rising or falling of photocurrent accompanied with light ON/OFF is also demanded. It is, however, difficult to achieve both of high wavelength selectivity and high response speed. There has been a concern that, when the wavelength selectivity is improved, sufficient response speed is not obtainable, or when the response speed is improved, the wavelength selectivity is deteriorated.

Accordingly, it is desirable to provide a photoelectric conversion element, an imaging device, and an electronic apparatus that make it possible to achieve both of high wavelength selectivity and high response speed.

A photoelectric conversion element according to an embodiment of the disclosure includes: a first electrode and a second electrode that are oppositely disposed; and a photoelectric conversion layer that is provided between the first electrode and the second electrode, and includes a high-molecular semiconductor material and a low-molecular material. The high-molecular semiconductor material has an absorption coefficient in a visible light region of 50000 $cm^{-1}$ or less. The low-molecular material includes an absorption peak in a wavelength range corresponding to one color in the visible light region.

An imaging device according to an embodiment of the disclosure includes one or a plurality of organic photoelectric converters in each of pixels. Each of the organic photoelectric converters includes: a first electrode and a second electrode that are oppositely disposed; and a photoelectric conversion layer that is provided between the first electrode and the second electrode, and includes a high-molecular semiconductor material and a low-molecular material. The high-molecular semiconductor material has an absorption coefficient in a visible light region of 50000 $cm^{-1}$ or less. The low-molecular material includes an absorption peak in a wavelength range corresponding to one color in the visible light region.

An electronic apparatus according to an embodiment of the disclosure includes the above-described imaging device according to the embodiment of the disclosure.

In the photoelectric conversion element, the imaging device, and the electronic apparatus according to the respective embodiments of the disclosure, the photoelectric conversion layer that contains the high-molecular semiconductor material having the absorption coefficient in the visible light region of 50000 $cm^{-1}$ or less and the low-molecular material including the absorption peak in the wavelength range corresponding to one color in the visible light region, is provided between the first electrode and the second electrode oppositely disposed. As a result, a continuous carrier path is formed in the photoelectric conversion layer, and sensitivity to light of a specific wavelength range is improved.

According to the photoelectric conversion element, the imaging device, and the electronic apparatus of the respective embodiments of the disclosure, the photoelectric conversion layer provided between the first electrode and the second electrode contains the high-molecular semiconductor material having the absorption coefficient in the visible light region of 50000 $cm^{-1}$ or less and the low-molecular material including the absorption peak in the wavelength range corresponding to one color in the visible light region. Accordingly, the continuous carrier path is formed in the photoelectric conversion layer, and the sensitivity to light of the specific wavelength range is improved. In other words, it is possible to improve response speed and wavelength selectivity. Note that the effects described here are not necessarily limiting, and any of effects described in the disclosure may be achieved.

BRIEF DESCRIPTION OF DRAWINGS

FIG. 1 is a cross-sectional view illustrating a schematic configuration of a photoelectric conversion element according to an embodiment of the disclosure.

FIG. 2 is a plan view illustrating formed position relationship between an organic photoelectric conversion layer, a protection film (upper electrode), and a contact hole.

FIG. 3A is a cross-sectional view illustrating a configuration example of an inorganic photoelectric converter.

FIG. 3B is another cross-sectional view of the inorganic photoelectric converter illustrated in FIG. 3A.

FIG. 4 is a cross-sectional view illustrating a configuration (lower side electron extraction) of a charge (electron) accumulation layer of an organic photoelectric converter.

FIG. 5A is a cross-sectional view to explain a method of manufacturing the photoelectric conversion element illustrated in FIG. 1.

FIG. 5B is a cross-sectional view illustrating a process following the process of FIG. 5A.

FIG. 6A is a cross-sectional view illustrating a process following the process of FIG. 5B.

FIG. 6B is a cross-sectional view illustrating a process following the process of FIG. 6A.

FIG. 7A is a cross-sectional view illustrating a process following the process of FIG. 6B.

FIG. 7B is a cross-sectional view illustrating a process following the process of FIG. 7A.

FIG. 7C is a cross-sectional view illustrating a process following the process of FIG. 7B.

FIG. 8 is a cross-sectional view of a main part to explain action of the photoelectric conversion element illustrated in FIG. 1.

FIG. 9 is a schematic diagram to explain the action of the photoelectric conversion element illustrated in FIG. 1.

FIG. 10 is a cross-sectional view illustrating a schematic configuration of a photoelectric conversion element according to a modification example of the disclosure.

FIG. 11 is a functional block diagram of an imaging device that uses, as a pixel, the photoelectric conversion element illustrated in FIG. 1 or FIG. 10.

FIG. 12 is a block diagram illustrating a schematic configuration of an electronic apparatus using the imaging device illustrated in FIG. 11.

MODES FOR CARRYING OUT THE INVENTION

An embodiment of the disclosure is described in detail below with reference to drawings. Note that description order is as follows.
1. Embodiment (example including organic photoelectric converter of single layer and two inorganic photoelectric converters)
   1-1. Basic configuration
   1-2. Manufacturing method
   1-3. Action and effects
2. Modification example (example including plurality of organic photoelectric converters)
   2-1. Basic configuration
   2-2. Action and effects
3. Application example
4. Examples

1. EMBODIMENT

FIG. 1 illustrates a cross-sectional configuration of a photoelectric conversion element (photoelectric conversion element 10) according to an embodiment of the disclosure. For example, the photoelectric conversion element 10 configures one pixel in an imaging device (described later) such as a CCD image sensor and a CMOS image sensor. The photoelectric conversion element 10 includes pixel transistors (including transfer transistors Tr1 to Tr3 described later) and a multilayer wiring layer (multilayer wiring layer 51) on front surface (surface S2 opposite to light receiving surface) side of a semiconductor substrate 11.

The photoelectric conversion element 10 according to the present embodiment includes a structure in which one organic photoelectric converter 11G and two inorganic photoelectric converters 11B and 11R that selectively detect light of wavelength ranges different from one another to perform photoelectric conversion are stacked in a vertical direction, and the organic photoelectric converter 11G contains a transparent high-molecular semiconductor material and a low-molecular material excellent in wavelength selectivity.

[1-1. Basic Configuration]

The photoelectric conversion element 10 includes the multilayer structure of the one organic photoelectric converter 11G and the two inorganic photoelectric converters 11B and 11R, and accordingly acquires signals of colors of red (R), green (G), and blue (B) by one element. The organic photoelectric converter 11G is provided on a rear surface (surface S1) of the semiconductor substrate 11, and the inorganic photoelectric converters 11B and 11R are embedded in the semiconductor substrate 11. The configuration of each component is described below.

[Organic Photoelectric Converter 11G]

The organic photoelectric converter 11G is an organic photoelectric conversion element that uses an organic semiconductor to absorb light of a selective wavelength range (here, green light), and generates electron-hole pairs. The organic photoelectric converter 11G includes a configuration in which an organic photoelectric conversion layer 17 is sandwiched between paired electrodes (lower electrode 15a and upper electrode 18) for extraction of signal charges. As described later, the lower electrode 15a and the upper electrode 18 are electrically coupled to electroconductive plugs 120a1 and 120b1 that are embedded in the semiconductor substrate 11, through a wiring layer and a contact metal layer 20. Note that the organic photoelectric conversion layer 17 of the present embodiment is a specific example of an "organic semiconductor layer" in the disclosure.

Specifically, in the organic photoelectric converter 11G, interlayer insulation films 12 and 14 are provided on the surface S1 of the semiconductor substrate 11. The interlayer insulation film 12 has through holes in regions facing the respective electroconductive plugs 120a1 and 120b1 described later, and electroconductive plugs 120a2 and 120b2 are embedded in the respective through holes. In the interlayer insulation film 14, wiring layers 13a and 13b are embedded in regions facing the electroconductive plugs 120a2 and 120b2, respectively. The lower electrode 15a is provided on the interlayer insulation film 14, and a wiring layer 15b that is electrically separated from the lower electrode 15a by an insulation film 16 is also provided on the interlayer insulation film 14. Among them, the organic photoelectric conversion layer 17 is provided on the lower electrode 15a, and the upper electrode 18 is provided so as to cover the organic photoelectric conversion layer 17. Although detail is described later, a protection layer 19 is provided on the upper electrode 18 so as to cover a surface of the upper electrode 18. A contact hole H is provided in a predetermined region of the protection layer 19, and the contact metal layer 20 that fills the contact hole H and extends up to a top surface of the wiring layer 15b is provided on the protection layer 19.

The electroconductive plug 120a2 functions as a connector together with the electroconductive plug 120a1, and forms, together with the electroconductive plug 120a1 and the wiring layer 13a, a transmission path of electric charges (electrons) from the lower electrode 15a to a green charge accumulation layer 110G described later. The electroconductive plug 120b2 functions as a connector together with the electroconductive plug 120b1, and forms a discharge path of electric charges (holes) from the upper electrode 18, together with the electroconductive plug 120b1, the wiring layer 13b, the wiring layer 15b, and the contact metal layer 20. To function as light shielding films, the electroconductive plugs 120a2 and 120b2 each desirably include a multilayer film of metal materials such as titanium (Ti), titanium nitride (TiN), and tungsten. Further, use of such a multilayer film is desirable because it is possible to secure contact with silicon even in a case where the electroconductive plugs 120a1 and 120b1 are each formed as an n-type or p-type semiconductor layer.

The interlayer insulation film 12 desirably includes an insulation film having a small interface level in order to reduce an interface level with the semiconductor substrate 11 (silicon layer 110) and to suppress occurrence of a dark current from an interface with the silicon layer 110. As such an insulation film, for example, a multilayer film of a hafnium oxide ($HfO_2$) film and a silicon oxide ($SiO_2$) film. The interlayer insulation film 14 includes, for example, a single layer film containing one of silicon oxide, silicon nitride, and silicon oxynitride (SiON), or a multilayer film containing two or more thereof.

The insulation film 16 includes, for example, a single layer film containing one of silicon oxide, silicon nitride, and silicon oxynitride (SiON), or a multilayer film containing two or more thereof. For example, the insulation film 16 has a planarized surface, and has a shape and a pattern forming almost no step with the lower electrode 15a. The insulation film 16 has a function of electrically separating the lower electrodes 15a of the respective pixels from one another in a case where the photoelectric conversion element 10 is used as the pixel of the imaging device.

The lower electrode 15a faces light receiving surfaces of the respective inorganic photoelectric converters 11B and 11R provided in the semiconductor substrate 11 and is provided in a region covering the light receiving surfaces. The lower electrode 15a includes an electroconductive film having light transparency, and includes, for example, ITO (indium tin oxide). As the material of the lower electrode 15a, however, a tin oxide ($SnO_2$) material added with a dopant, or a zinc oxide material obtained by adding a dopant to aluminum zinc oxide (ZnO) may be used in addition to ITO. Examples of the zinc oxide material include aluminum zinc oxide (AZO) added with aluminum (Al) as a dopant, gallium zinc oxide (GZO) added with gallium (Ga), and indium zinc oxide (IZO) added with indium (In). Further, CuI, $InSbO_4$, ZnMgO, $CuInO_2$, $MgIN_2O_4$, CdO, $ZnSnO_3$, etc. may be used in addition thereto. Note that, in the present embodiment, the signal charges (electrons) are extracted from the lower electrode 15a. Therefore, in the imaging device described later that uses the photoelectric conversion element 10 as the pixel, the lower electrode 15a is formed separately for each pixel.

The organic photoelectric conversion layer 17 includes a p-type semiconductor and an n-type semiconductor. For example, one of the p-type semiconductor and the n-type semiconductor preferably includes a transparent material, and the other preferably includes a material that photoelectrically converts light of a selective wavelength range. Here, the transparent material is, for example, a high-molecular semiconductor material that has an absorption coefficient in a visible light region of 50000 $cm^{-1}$ or less. The material that photoelectrically converts the light of the selective wavelength range is, for example, a low-molecular material that has an absorption peak in a wavelength range corresponding to one color in the visible light region. Further, the visible light region is a range of 450 nm or more and 750 nm or less, the "high-molecular" indicates a molecular weight of 3000 or more, and the "low-molecular" indicates a molecular weight of less than 3000. In the present embodiment, for example, it is possible for the organic photoelectric conversion layer 17 to photoelectrically convert green light corresponding to a portion of or an entire wavelength range of 480 nm to 620 nm. Such an organic photoelectric conversion layer 17 has a thickness of, for example, 50 nm to 500 nm.

As described above, the high-molecular semiconductor material is preferably the p-type semiconductor or the n-type semiconductor, and preferably has the absorption coefficient of 50000 $cm^{-1}$ or less in the visible light region. Examples of the p-type high-molecular semiconductor material include a compound (fluorene derivative or triphenylamine derivative) represented in the following general formula (1) or (2) containing fluorene or triphenylamine as a mother skeleton. Specifically, for example, formulae (1-1), (2-1), and (2-2) are exemplified. Further, the fluorene derivative and the triphenylamine derivative may be bonded to each other. Examples of the compounds bonded to each other include compounds of Poly[(9,9-dioctylfluorene)-co-N-(4-butylphenyl)diphenylamine)](TFB) represented in a formula (3-1) and Poly[(9,9-dioctylfluorene-co-bis-N,N'-(4-butylphenyl)-bis-N,N'-phenyl-1,4-phenylenediamine)] (PFB) represented in a formula (3-2). In addition, for example, a compound represented in a formula (3-3) is exemplified.

[Chemical Formula 1]
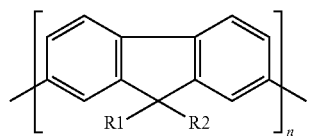
(1)
[Chemical Formula 2]
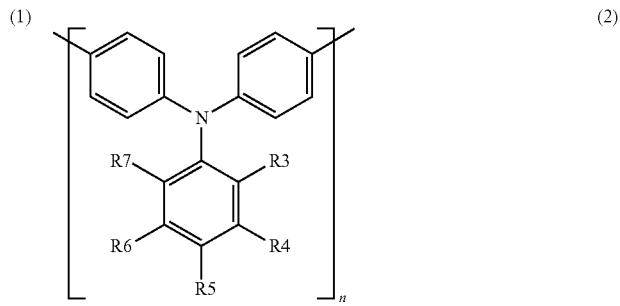
(2)
[Chemical Formula 3]
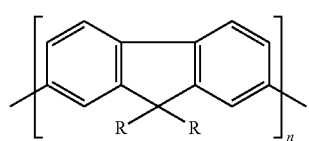
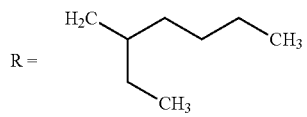
(1-1)
[Chemical Formula 4]
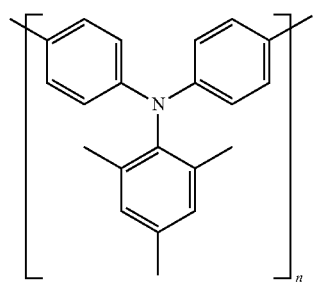
(2-1)
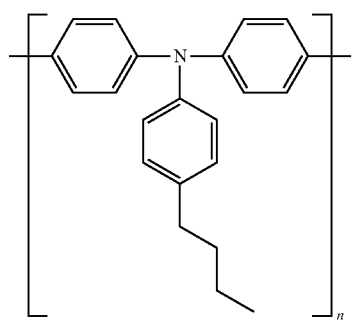
(2-2)
[Chemical Formula 5]
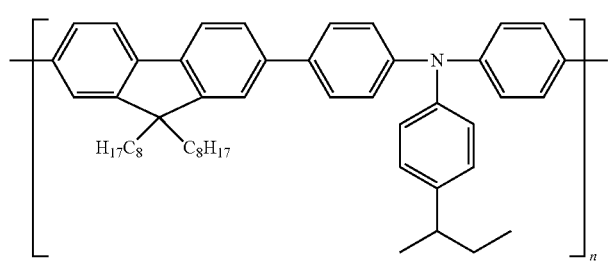
(3-1)

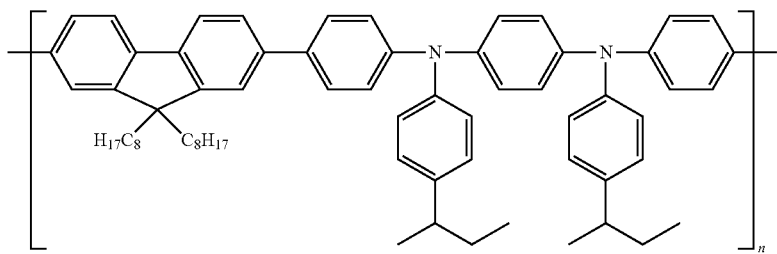
(3-2)

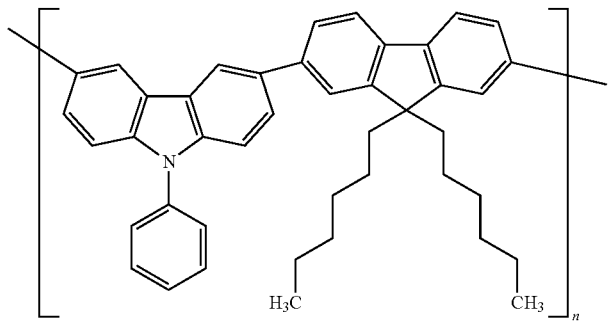
(3-3)

Examples of the n-type high-molecular semiconductor material include a compound (naphthalenediimide derivative) represented in the following general formula (4) containing naphthalenediimide as a mother skeleton. Specific examples of the naphthalenediimide derivative include a compound represented in a formula (4-1).

[Chemical Formula 6]

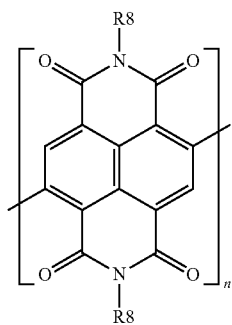
(4)

(R8 are each independently a hydrogen atom, a straight chain, branched, or cyclic alkyl group, a phenyl group, a group containing a straight chain or ring-fused aromatic compound, a group containing a straight chain or ring-fused heterocyclic compound, a group containing a halide, a group containing a partial fluoroalkyl group, a perfluoroalkyl group, a silylalkyl group, a silylalkoxy group, or an aryl silyl group, or a derivative thereof.)

[Chemical Formula 7]

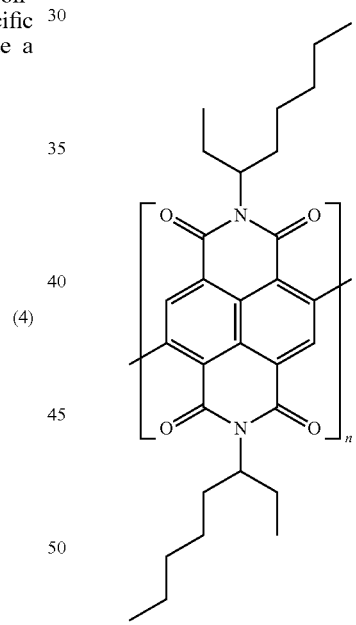
(4-1)

As described above, the low-molecular material is preferably the p-type semiconductor or the n-type semiconductor, and preferably has the absorption peak in the wavelength range corresponding to one color of the visible light region. Specifically, the low-molecular material preferably has an absorption coefficient $\alpha$ ($cm^{-1}$) in which an absorption peak in one of a blue region, a green region, and a red region described below is 50000 or more. For example, the wavelength range of the blue region is 430 nm or more and 540 nm or less, the wavelength range of the green region is 480 nm or more and 620 nm or less, and the wavelength range of the red region is 560 nm or more and 780 nm or less. More desirably, the wavelength range of the blue region is 450 nm or more and less than 500 nm, the wavelength range of the green region is 500 nm or more and less than 600 nm, and the wavelength range of the red region is 600 nm or more and less than 750 nm. Note that the organic photoelectric conversion layer 17 preferably includes both of the p-type semiconductor and the n-type semiconductor. In a case of using the p-type semiconductor as the high-molecular semiconductor material, the low-molecular material is preferably selected from the n-type semiconductor, and in a case of using the n-type semiconductor as the high-molecular semiconductor material, the low-molecular material is preferably selected from the p-type semiconductor. In this case, a compound having an absorption coefficient α ($cm^{-1}$) in which the absorption peak of the green region (480 nm or more and 620 nm or less) is 50000 or more is described as an example.

Examples of the n-type low-molecular material include a subphthalocyanine derivative represented in a general formula (5) and perylene bisimide represented in a general formula (6) and a derivative thereof. Specific examples of the foregoing compounds include formulae (5-1) and (5-2), and formulae (6-1) and (6-2). In addition, for example, compounds represented in formulae (7-1) to (7-3) are also exemplified.

[Chemical Formula 8]

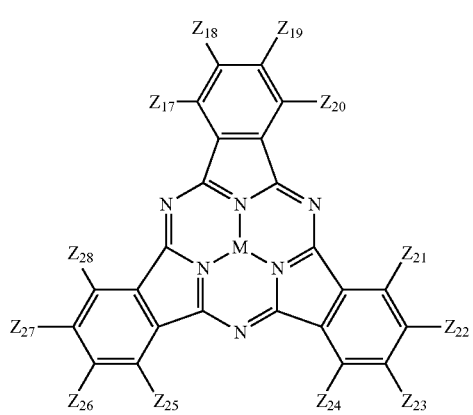

(5)

($Z_{17}$ to $Z_{29}$ are each independently a hydrogen atom, a halogen atom, a straight chain, branched, or cyclic alkyl group, a phenyl group, a group containing a straight chain or ring-fused aromatic compound, a group containing a halide, a partial fluoroalkyl group, a perfluoroalkyl group, a silylalkyl group, a silylalkoxy group, an aryl silyl group, an arylsulfanyl group, an alkylsulfanyl group, an arylsulfonyl group, an alkylsulfonyl group, an aryl sulfide group, an alkyl sulfide group, an amino group, an alkyl amino group, an aryl amino group, a hydroxy group, an alkoxy group, an acylamino group, an acyloxy group, a carbonyl group, a carboxy group, a carboxamido group, a carboalkoxy group, an acyl group, a sulfonyl group, a cyano group, a nitro group, a group containing chalcogenide, a phosphine group, a phosphon group, or a derivative thereof. n is an integer of two or more. M is a boron atom.)

[Chemical Formula 9]

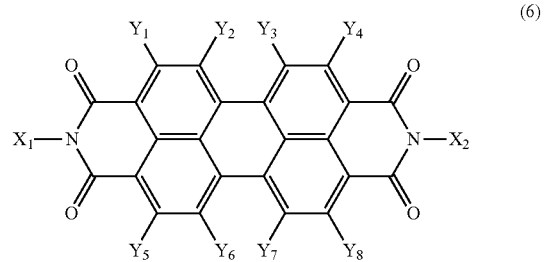

(6)

(X1 and X2 are each independently a hydrogen atom, an alkyl group, a fluoroalkyl group, a phenyl group, a fluorophenyl group, a chlorophenyl group, a hydroxyl group, an alkoxyl group, a carbonyl group, an acetyl group, an ester group, a cyano group, or a derivative thereof. Y1 to Y 8 are each independently a hydrogen atom, a halogen atom, an alkyl group, a fluoroalkyl group, a phenyl group, a fluorophenyl group, a chlorophenyl group, a hydroxyl group, an alkoxyl group, an amino group, an alkyl amino group, a carbonyl group, an acetyl group, an ester group, a nitro group, a cyano group, or a derivative thereof.)

[Chemical Formula 10]

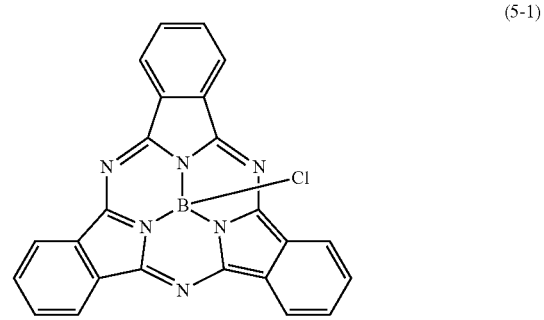

(5-1)

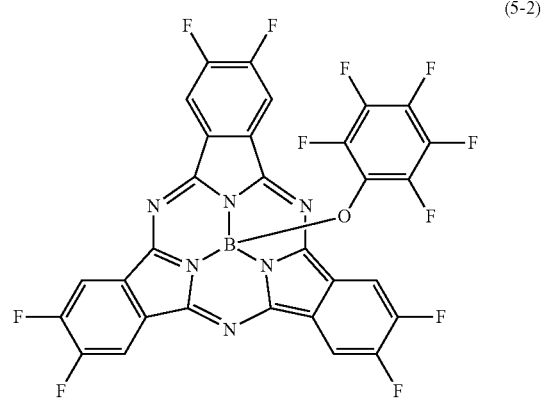

(5-2)

[Chemical Formula 11]

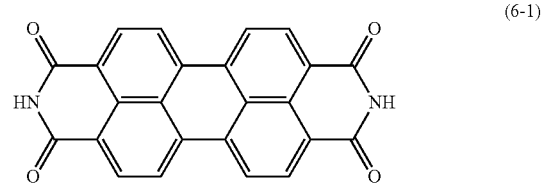

(6-1)

-continued (6-2)
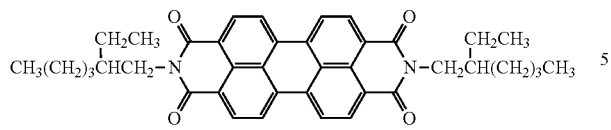

[Chemical Formula 12]

(7-1)
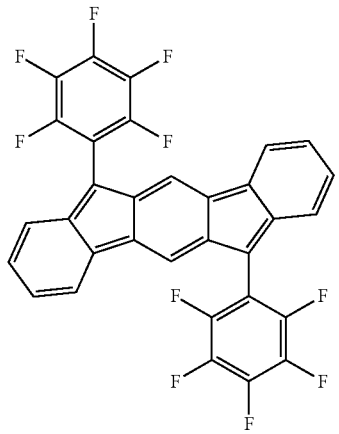

(7-2)
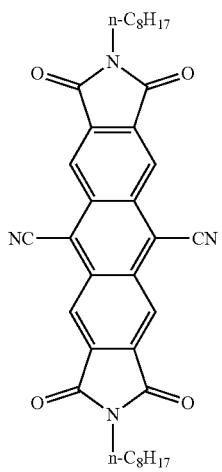

(7-3)
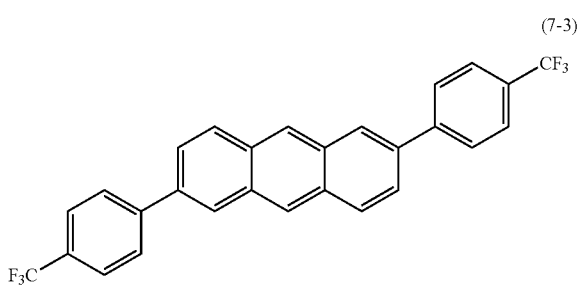

Examples of the p-type low-molecular material include quinacridone (QD) (formula (8-1)) and a derivative thereof (formula (8-2)), and Boron-Dipyrromethene (BODIPY) (formula (9-1)) and a derivative thereof (formula (9-2)). Note that subphthalocyanine and a derivative thereof (above-described formula (5-1)) also functions as the p-type semiconductor depending on a material to be combined.

[Chemical Formula 13]

(8-1)
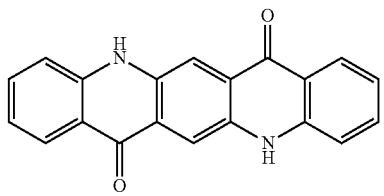

(8-2)
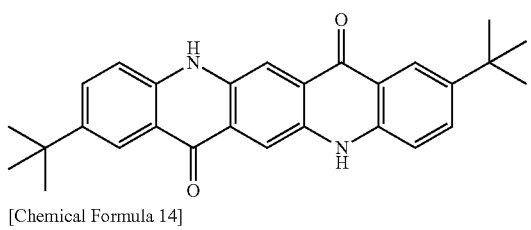

[Chemical Formula 14]

(9-1)
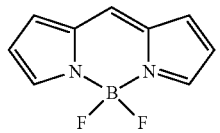

(9-2)
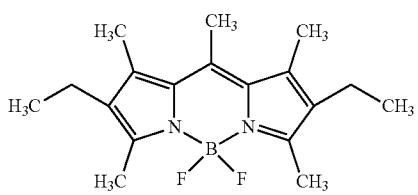

Unillustrated other layers may be provided between the organic photoelectric conversion layer 17 and the lower electrode 15a and between the organic photoelectric conversion layer 17 and the upper electrode 18. For example, an undercoat film, a hole transport layer, an electron blocking film, the organic photoelectric conversion layer 17, a hole blocking film, a buffer film, an electron transport layer, and a work function adjustment film may be stacked in order from the lower electrode 15a side. The above-described compounds may be used for each of the electron blocking film, the hole blocking film, the electron transport layer, and the hole transport layer.

The upper electrode 18 includes an electroconductive film having light transparency similar to that of the lower electrode 15a. In the imaging device using the photoelectric conversion element 10 as the pixel, the upper electrode 18 may be separated for each of pixels or may be provided as an electrode common to the pixels. The upper electrode 18 has a thickness of, for example, 10 nm to 200 nm.

The protection layer 19 includes a material having light transparency, and is a single layer film containing, for example, one of silicon oxide, silicon nitride, and silicon oxynitride, or a multilayer film containing two or more thereof. The protection film 19 has a thickness of, for example, 100 nm to 30000 nm.

The contact metal layer 20 includes one of, for example, titanium, tungsten, titanium nitride, and aluminum, or a multilayer film containing two or more thereof.

The upper electrode 18 and the protection layer 19 are provided, for example, so as to cover the organic photoelectric conversion layer 17. FIG. 2 illustrates a planar configuration of the organic photoelectric conversion layer 17, the protection film 19 (upper electrode 18), and the contact hole H.

Specifically, a peripheral edge e2 of the protection layer 19 (also upper electrode 18) is located on outside of a peripheral edge e1 of the organic photoelectric conversion layer 17, and the protection layer 19 and the upper electrode 18 are provided to extend to the outside of the organic photoelectric conversion layer 17. In detail, the upper electrode 18 is provided so as to cover a top surface and a side surface of the organic photoelectric conversion layer 17 and to extend on the insulation film 16. The protection layer 19 is provided in a planar shape equivalent to the upper electrode 18 so as to cover a top surface of such an upper electrode 18. The contact hole H is provided in a region (region on outside of peripheral edge e1) of the protection layer 19 not facing the organic photoelectric conversion layer 17, and exposes a portion of the surface of the upper electrode 18. A distance between the peripheral edges e1 and e2 is not particularly limited, and for example, 1 μm to 500 μm. Note that, in FIG. 2, one rectangular contact hole H along an end side of the organic photoelectric conversion layer 17 is provided; however, a shape and the number of the contact hole H are not limited thereto, and the contact hole may have other shapes (e.g., circular shape or square shape) or a plurality of contact holes may be provided.

A planarization film 21 is provided on the protection layer 19 and the contact metal layer 20 so as to cover the entire surface. An on-chip lens 22 (microlens) is provided on the planarization film 21. The on-chip lens 22 condenses light entered from the above, to the light receiving surfaces of the organic photoelectric converter 11G and the inorganic photoelectric converters 11B and 11R. In the present embodiment, the multilayer wiring layer 51 is provided on the surface S2 side of the semiconductor substrate 11, and it is accordingly possible to dispose the light receiving surfaces of the organic photoelectric converter 11G and the inorganic photoelectric converters 11B and 11R close to one another, and to reduce sensitivity variation among colors caused depending on an F value of the on-chip lens 22.

Note that, in the photoelectric conversion element 10 according to the present embodiment, the signal charges (electrons) are extracted from the lower electrode 15a. Therefore, in the imaging device using the photoelectric conversion element 10 as the pixel, the upper electrode 18 may serve as a common electrode. In this case, the transmission path including the contact hole H, the contact metal layer 20, the wiring layers 15b and 13b, and the electroconductive plugs 120b1 and 120b2 described above may be provided on at least one position with respect to all pixels.

The semiconductor substrate 11 includes the inorganic photoelectric converters 11B and 11R and the green charge accumulation layer 110G that are embedded in, for example, the predetermined region of the n-type silicon (Si) layer 110. The electroconductive plugs 120a1 and 120b1 serving as the transmission path of electric charges (electrons or holes (holes)) from the organic photoelectric converter 11G are also embedded in the semiconductor substrate 11. In the present embodiment, the rear surface (surface S1) of the semiconductor substrate 11 serves as the light receiving surface. The plurality of pixel transistors (including transfer transistors Tr1 to Tr3) corresponding to the respective organic photoelectric converter 11G and inorganic photoelectric converters 11B and 11R, and a peripheral circuit including a logic circuit are provided on the front surface (surface S2) side of the semiconductor substrate 11.

Examples of the pixel transistor include a transfer transistor, a reset transistor, an amplification transistor, and a selection transistor. These pixel transistors each include, for example, an MOS transistor, and are provided in a p-type semiconductor well region on the surface S2 side. A circuit including such a pixel transistor is provided for each of the photoelectric converters of red, green, and blue. Each circuit may have a three transistor configuration that includes three transistors in total, for example, the transfer transistor, the reset transistor, and the amplification transistor among these pixel transistors, or may have a four transistor configuration that further includes the selection transistor. In this example, among these pixel transistors, only the transfer transistors Tr1 to Tr3 are illustrated and described. Further, the pixel transistors other than the transfer transistors may be shared among the photoelectric converters or the pixels. Moreover, a so-called pixel sharing structure that shares a floating diffusion is also applicable.

The transfer transistors Tr1 to Tr3 include a gate electrode (gate electrodes TG1 to TG3) and floating diffusions (FDs 113, 114, and 116). The transfer transistor Tr1 transfers, to a vertical signal line Lsig described later, the signal charges (electrons in present embodiment) corresponding to green that have been generated in the organic photoelectric converter 11G and accumulated in the green charge accumulation layer 110G. The transfer transistor Tr2 transfers, to the vertical signal line Lsig described later, the signal charges (electrons in present embodiment) corresponding to blue that have been generated and accumulated in the inorganic photoelectric converter 11B. Likewise, the transfer transistor Tr3 transfers, to the vertical signal line Lsig described later, the signal charges (electrons in present embodiment) corresponding to red that have been generated and accumulated in the inorganic photoelectric converter 11R.

Each of the inorganic photoelectric converters 11B and 11R is a photodiode (Photo Diode) including a pn junction, and the inorganic photoelectric converters 11B and 11R are provided in an optical path in the semiconductor substrate 11 in this order from the surface S1 side. Among them, the inorganic photoelectric converter 11B selectively detects blue light and accumulates the signal charges corresponding to blue color, and is provided to extend, for example, from a selective region along the surface S1 of the semiconductor substrate 11 to the region near an interface with the multilayer wiring layer 51. The inorganic photoelectric converter 11R selectively detects red light and accumulates the signal charges corresponding to red color, and is provided, for example, over the region below the inorganic photoelectric converter 11B (on surface S2 side). Note that blue (B) is a color corresponding to a wavelength range of, for example, 450 nm to 495 nm, and red (R) is a color corresponding to a wavelength range of, for example, 620 nm to 750 nm. It is sufficient for each of the inorganic photoelectric converters 11B and 11R to detect the light of a portion of or the entire corresponding wavelength range.

FIG. 3A illustrates a detailed configuration example of the inorganic photoelectric converters 11B and 11R. FIG. 3B corresponds to a configuration in another cross-section of FIG. 3A. Note that, in the present embodiment, a case where electrons of the electron-hole pairs generated by photoelectric conversion are read out as signal charges (case where n-type semiconductor region serves as photoelectric conversion layer) is described. Further, in the figure, a symbol "+(plus)" provided as a superscript on "p" or "n" indicates high impurity concentration of the p type or the n type.

Furthermore, among the pixel transistors, the gate electrodes TG2 and TG3 of the respective transfer transistors Tr2 and Tr3 are also illustrated.

The inorganic photoelectric converter 11B includes, for example, a p-type semiconductor region (hereinafter, simply referred to as p-type region, n type is similarly described) 111p serving as a hole accumulation layer and an n-type photoelectric conversion layer (n-type region) 111n serving as an electron accumulation layer. Each of the p-type region 111p and the n-type photoelectric conversion layer 111n is provided in a selective region near the surface S1, and is partially bent and extends so as to reach an interface with the surface S2. The p-type region 111p is coupled to the unillustrated p-type semiconductor well region on the surface S1 side. The n-type photoelectric conversion layer 111n is coupled to the FD 113 (n-type region) of the transfer transistor Tr2 for blue color. Note that a p-type region 113p (hole accumulation layer) is provided near an interface between the surface S2 and end parts of the p-type region 111p and the n-type photoelectric conversion layer 111n on the surface S2 side.

The inorganic photoelectric converter 11R is configured by, for example, sandwiching an n-type photoelectric conversion layer 112n (electron accumulation layer) between p-type regions 112p1 and 112p2 (hole accumulation layers) (has p-n-p multilayer structure). The n-type photoelectric conversion layer 112n is partially bent and extends so as to reach the interface with the surface S2. The n-type photoelectric conversion layer 112n is coupled to the FD 114 (n-type region) of the transfer transistor Tr3 for red color. Note that the p-type region 113p (hole accumulation layer) is provided near an interface between the surface S2 and at least an end part of the n-type photoelectric conversion layer 111n on the surface S2 side.

FIG. 4 illustrates a detailed configuration example of the green charge accumulation layer 110G. Note that, in this example, a case where electrons of the electron-hole pairs generated by the organic photoelectric converter 11G are read as the signal charges from the lower electrode 15a side is described. In addition, FIG. 4 also illustrates the gate electrode TG1 of the transfer transistor Tr1 among the pixel transistors.

The green charge accumulation layer 110G includes an n-type region 115n serving as an electron accumulation layer. A portion of the n-type region 115n is coupled to the electroconductive plug 120a1, and accumulates electrons that are transmitted from the lower electrode 15a side through the electroconductive plug 120a1. The n-type region 115n is also coupled to the FD 116 (n-type region) of the transfer transistor Tr1 for green color. Note that a p-type region 115p (hole accumulation layer) is provided near an interface between the n-type region 115n and the surface S2.

The electroconductive plugs 120a1 and 120b1 function as connectors with the organic photoelectric converter 11G and the semiconductor substrate 11, together with the electroconductive plugs 120a2 and 120b2 described later, and serve as the transmission path of the electrons or the holes generated in the organic photoelectric converter 11G together with the electroconductive plugs 120a2 and 120b2 described later. In the present embodiment, the electroconductive plug 120a1 is conducted with the lower electrode 15a of the organic photoelectric converter 11G, and is coupled to the green charge accumulation layer 110G. The electroconductive plug 120b1 is conducted with the upper electrode 18 of the organic photoelectric converter 11G and is a wiring to discharge the holes.

Each of the electroconductive plugs 120a1 and 120b1 includes, for example, an electroconductive semiconductor layer, and is embedded in the semiconductor substrate 11. In this case, the electroconductive plug 120a1 is preferably of the n type (because of serving as transmission path of electrons), and the electroconductive plug 120b1 is preferably of the p type (because of serving as transmission path of holes). Alternatively, for example, each of the electroconductive plugs 120a1 and 120b1 may be configured by filling a through via with an electroconductive film material such as tungsten. In this case, for example, to suppress short circuit with silicon, a via side surface is desirably covered with an insulation film including silicon oxide ($SiO_2$), silicon nitride (SiN), etc.

The multilayer wiring layer 51 is provided on the surface S2 of the semiconductor substrate 11. In the multilayer wiring layer 51, a plurality of wirings 51a are disposed with an interlayer insulation film 52 in between. As described above, in the photoelectric conversion element 10, the multilayer wiring layer 51 is provided on side opposite to the light receiving surface, and a so-called rear-surface irradiation imaging device is achievable. For example, a supporting substrate 53 including silicon is bonded to the multilayer wiring layer 51.

[1-2. Manufacturing Method]

For example, the photoelectric conversion element 10 is manufactured in the following manner. FIG. 5A to FIG. 7C illustrate a method of manufacturing the photoelectric conversion element 10 in process order. Note that FIG. 7A to FIG. 7C each illustrate only a configuration of a main part of the photoelectric conversion element 10.

First, the semiconductor substrate 11 is formed. Specifically, a so-called SOI substrate in which a silicon layer 110 is provided on a silicon base 1101 with the silicon oxide film 1102 in between, is prepared. Note that the surface of the silicon layer 110 on the silicon oxide film 1102 side becomes the rear surface (surface S1) of the semiconductor substrate 11. In FIG. 5A and FIG. 5B, the configuration is illustrated in a state vertically reversed from the configuration illustrated in FIG. 1. Subsequently, as illustrated in FIG. 5A, the electroconductive plugs 120a1 and 120b1 are formed in the silicon layer 110. At this time, the electroconductive plugs 120a1 and 120b1 are formed by, for example, forming the through via in the silicon layer 110 and then filling the through via with the above-described barrier metal such as silicon nitride, and tungsten. Alternatively, for example, an electroconductive impurity semiconductor layer may be formed through ion injection to the silicon layer 110. In this case, the electroconductive plug 120a1 is formed as the n-type semiconductor layer, and the electroconductive plug 120b1 is formed as the p-type semiconductor layer. Thereafter, for example, the inorganic photoelectric converters 11B and 11R each including the p-type region and the n-type region as illustrated in FIG. 3A are formed, through ion injection, in regions different in depth in the silicon layer 110 (so as to be overlapped with each other). Further, the green charge accumulation layer 110G is formed, through ion injection, in a region adjacent to the electroconductive plug 120a1. The semiconductor substrate 11 is formed in the above-described manner.

Next, the pixel transistors including the transfer transistors Tr1 to Tr3 and the peripheral circuits such as the logic circuit are formed on the surface S2 side of the semiconductor substrate 11, and then, the plurality of layers of wirings 51a with the interlayer insulation film 52 in between are formed on the surface S2 of the semiconductor substrate 11 to form the multilayer wiring layer 51, as illustrated in FIG. 5B. Subsequently, the supporting substrate 53 including silicon is bonded to the multilayer wiring layer 51, and then, the silicon base 1101 and the silicon oxide film 1102 are removed from the surface S1 side of the semiconductor substrate 11, to expose the surface S1 of the semiconductor substrate 11.

Next, the organic photoelectric converter 11G is formed on the surface S1 of the semiconductor substrate 11. Specifically, as illustrated in FIG. 6A, the interlayer insulation film 12 that includes a multilayer film of the hafnium oxide film and the silicon oxide film described above is first formed on the surface S1 of the semiconductor substrate 11. After the hafnium oxide film is formed by, for example, an ALD (atomic layer deposition) method, the silicon oxide film is formed by, for example, a plasma CVD (Chemical Vapor Deposition) method. Thereafter, contact holes H1a and H1b are formed in the interlayer insulation film 12 at positions respectively facing the electroconductive plugs 120a1 and 120b1, and the electroconductive plugs 120a2 and 120b2 each including the above-described material are formed so as to fill the contact holes H1a and H1b. At this time, the electroconductive plugs 120a2 and 120b2 may be formed so as to extend to a region desired to be shielded from light (so as to cover region desired to be shielded from light), or a light shielding layer may be formed in a region separated from the electroconductive plugs 120a2 and 120b2.

Subsequently, as illustrated in FIG. 6B, the interlayer insulation film 14 including the above-described material is formed by, for example, a plasma CVD method. Note that, after film formation, a surface of the interlayer insulation film 14 is desirably planarized by, for example, a CMP (Chemical Mechanical Polishing) method. Next, the contact holes are opened in the interlayer insulation film 14 at positions facing the respective electroconductive plugs 120a2 and 120b2, and the contact holes are filled with the above-described material to form the wiring layers 13a and 13b. Note that, thereafter, a surplus wiring layer material (such as tungsten) on the interlayer insulation film 14 is desirably removed by, for example, a CMP method. Subsequently, the lower electrode 15a is formed on the interlayer insulation film 14. Specifically, first, the above-described transparent electroconductive film is formed over the entire surface of the interlayer insulation film 14 by, for example, a sputtering method. Thereafter, a selective portion is removed, for example, with use of dry etching or wet etching using a photolithography method (by performing exposure, development, post-baking, etc. of photoresist film), to form the lower electrode 15a. At this time, the lower electrode 15a is formed in a region facing the wiring layer 13a. In addition, when the transparent electroconductive film is processed, the transparent electroconductive film is caused to remain also in a region facing the wiring layer 13b, to form, together with the lower electrode 15a, the wiring layer 15b that configures a portion of the transmission path of the holes.

Subsequently, the insulation film 16 is formed. At this time, first, the insulation film 16 including the above-described material is formed over the entire surface of the semiconductor substrate 11 by, for example, a plasma CVD method so as to cover the interlayer insulation film 14, the lower electrode 15a, and the wiring layer 15b. Thereafter, as illustrated in FIG. 7A, the formed insulation film 16 is polished by, for example, a CMP method to expose the lower electrode 15a and the wiring layer 15b from the insulation film 16, and to alleviate (desirably planarize) a step between the lower electrode 15a and the insulation film 16.

Next, as illustrated in FIG. 7B, the organic photoelectric conversion layer 17 is formed on the lower electrode 15a. At this time, the photoelectric conversion material including the above-described material is formed with a pattern by, for example, a vacuum evaporation method using a metal mask. Note that, as described above, when the other organic layers (such as electron blocking layer) are formed above or below the organic photoelectric conversion layer 17, the layers are desirably formed successively in a vacuum process (in continuous vacuum process) with use of the same metal mask. Moreover, the method of forming the organic photoelectric conversion layer 17 is not necessarily limited to the above-described method using the metal mask, and other method, for example, a printing technique may be used.

Subsequently, as illustrated in FIG. 7C, the upper electrode 18 and the protection layer 19 are formed. First, the upper electrode 18 including the above-described transparent electroconductive film is formed over the entire surface of the substrate by, for example, a vacuum evaporation method or a sputtering method so as to cover the top surface and the side surface of the organic photoelectric conversion layer 17. Note that the organic photoelectric conversion layer 17 is easily varied in characteristics due to influence of moisture, oxygen, hydrogen, etc., and thus, the upper electrode 18 is desirably formed together with the organic photoelectric conversion layer 17 in the continuous vacuum process. Thereafter (before patterning of upper electrode 18), the protection layer 19 including the above-described material is formed by, for example, a plasma CVD method so as to cover the top surface of the upper electrode 18. Next, the protection layer 19 is formed on the upper electrode 18, and the upper electrode 18 is then processed.

Thereafter, selective portions of the upper electrode 18 and the protection layer 19 are collectively removed by etching using a photolithography method. Subsequently, the contact hole H is formed in the protection layer 19 by, for example, etching using a photolithography method. At this time, the contact hole H is desirably formed in a region not facing the organic photoelectric conversion layer 17. Also after the formation of the contact hole H, the photoresist is removed and washing with use of a chemical solution is performed in a manner as described above. Therefore, the upper electrode 18 is exposed from the protection layer 19 in the region facing the contact hole H. Accordingly, in consideration of occurrence of a pin hole as described above, the contact hole H is desirably provided by avoiding the formation region of the organic photoelectric conversion layer 17. Subsequently, the contact metal layer 20 including the above-described material is formed by, for example, a sputtering method. At this time, the contact metal layer 20 is formed on the protection layer 19 so as to fill the contact hole H and as to extend to the top surface of the wiring layer 15b. Finally, the planarization film 21 is formed over the entire surface of the semiconductor substrate 11, and then, the on-chip lens 22 is formed on the planarization film 21. As a result, the photoelectric conversion element 10 as illustrated in FIG. 1 is completed.

In the above-described photoelectric conversion element 10, for example, as the pixel of the imaging device, the signal charges are acquired in the following manner. Specifically, as illustrated in FIG. 8, when light L enters the photoelectric conversion element 10 through the on-chip lens 22 (not illustrated in FIG. 8), the light L passes through the organic photoelectric converter 11G and the inorganic photoelectric converters 11B and 11R in order, and is photoelectrically converted for light of each color of red, green, and blue in the passing process. FIG. 9 schematically illustrates a flow of signal charge (electron) acquisition based on the entering light. In the following, specific signal acquiring operation in each of the photoelectric converters is described.

[Acquisition of Green Signal by Organic Photoelectric Converter 11G]

First, green light Lg of the light L entering the photoelectric conversion element 10 is selectively detected (absorbed) and photoelectrically converted by the organic photoelectric converter 11G. Electrons Eg of electron-hole pairs thus generated are extracted from the lower electrode 15a side, and the electrons Eg are then accumulated in the green charge accumulation layer 110G through a transmission path A (wiring layer 13a and electroconductive plugs 120a1 and 120a2). The accumulated electrons Eg are transferred to the FD 116 in reading operation. Note that holes Hg are discharged from the upper electrode 18 side through a transmission path B (contact metal layer 20, wiring layers 13b and 15b, and electroconductive plugs 120b1 and 120b2).

Specifically, the signal charges are accumulated in the following manner. More specifically, in the present embodiment, for example, a predetermined negative potential VL (<0 V) is applied to the lower electrode 15a, and a potential VU (<VL) lower than the potential VL is applied to the upper electrode 18. Note that the potential VL is applied to the lower electrode 15a, for example, from the wiring 51a in the multilayer wiring layer 51 through the transmission path A. The potential VL is applied to the upper electrode 18, for example, from the wiring 51a in the multilayer wiring layer 51 through the transmission path B. As a result, the electrons of the electron-hole pairs generated in the organic photoelectric conversion layer 17 are guided to the lower electrode 15a side that is relatively high in potential (holes are guided to upper electrode 18 side) in a charge accumulation state (off state of unillustrated reset transistor and transfer transistor Tr1). The electrons Eg are extracted from the lower electrode 15a in the above-described manner and are accumulated in the green charge accumulation layer 110G (in detail, n-type region 115n) through the transmission path A. Further, the accumulation of the electrons Eg varies the potential VL of the lower electrode 15 conducted with the green charge accumulation layer 110G. The variation amount of the potential VL corresponds to the signal potential (here, potential of green signal).

Further, in the reading operation, the transfer transistor Tr1 is put into the ON state, and the electrons Eg accumulated in the green charge accumulation layer 110G are transferred to the FD 116. As a result, the green signal based on the light receiving amount of the green light Lg is read out to the vertical signal line Lsig described later through the unillustrated other pixel transistor. Thereafter, the unillustrated reset transistor and the transfer transistor Tr1 are put into the ON state, and the FD 116 as the n-type region and the charge accumulation region (n-type region 115n) of the green charge accumulation layer 110G are reset to, for example, a power voltage VDD.

[Acquisition of Blue Signal and Red Signal by Inorganic Photoelectric Converters 11B and 11R]

Subsequently, blue light and red light of the light that has passed through the organic photoelectric converter 11G are respectively absorbed and photoelectrically converted by the inorganic photoelectric converters 11B and 11R in order. In the inorganic photoelectric converter 11B, electrons Eb corresponding to the entering blue light are accumulated in the n-type region (n-type photoelectric conversion layer 111n), and the accumulated electrons Ed are transferred to the FD 113 in the reading operation. Note that the holes are accumulated in the unillustrated p-type region. Likewise, in the inorganic photoelectric converter 11R, electrons Er corresponding to the entering red light are accumulated in the n-type region (n-type photoelectric conversion layer 112n), and the accumulated electrons Er are transferred to the FD 114 in the reading operation. Note that the holes are accumulated in the unillustrated p-type region.

As described above, in the charge accumulation state, the negative potential VL is applied to the lower electrode 15a of the organic photoelectric converter 11G. Therefore, hole concentration of the p-type region (p-type region 111p in FIG. 2) that is the hole accumulation layer of the inorganic photoelectric converter 11B tends to increase. This makes it possible to suppress occurrence of a dark current at the interface between the p-type region 111p and the interlayer insulation film 12.

In the reading operation, the transfer transistors Tr2 and Tr3 are put into the ON state, and the electrons Eb and Er accumulated in the n-type photoelectric conversion layers 111n and 112n are transferred to the FDs 113 and 114, respectively, as with the above-described organic photoelectric converter 11G. As a result, the blue signal based on the light receiving amount of the blue light Lb and the red signal based on the light receiving amount of the red light Lr are read out to the vertical signal lines Lsig described later through the unillustrated other pixel transistors. Thereafter, the unillustrated reset transistor and the transfer transistors Tr2 and Tr3 are put into the ON state, and the FDs 113 and 114 as the n-type regions are reset to, for example, the power voltage VDD.

As described above, the organic photoelectric converter 11G and the inorganic photoelectric converters 11B and 11R are stacked in the vertical direction, which makes it possible to separately detect the color light of red, green, and blue to acquire the signal changes of the respective colors without providing the color filter. This makes it possible to suppress light loss (sensitivity degradation) caused by color light absorption of the color filter and occurrence of a false color accompanying pixel interpolation processing.

[1-3. Action and Effects]

As described above, in recent years, high sensitivity, low noise, and high color reproducibility are demanded for the imaging device such as a CCD image sensor and a CMOS image sensor. To meet the demand, for example, the imaging device in which the organic photoelectric converter that detects the green light and generates the corresponding signal charges and the photodiodes (inorganic photoelectric converters) that detect the respective red and blue light are stacked, and the image sensor that has a multilayer structure in which the organic photoelectric conversion films having sensitivity to the blue light (B), the green light (G), and the red light (R) are stacked, have been developed. The devices acquire signals of three colors by one pixel to improve photoelectric conversion efficiency and sensitivity of one pixel.

The material configuring the organic photoelectric conversion layer has been studied in order to further improve the device characteristics of the imaging devices. For example, an imaging device in which a quinacridone derivative (low-molecular material) and a compound (low-molecular material) that does not absorb light of a specific wavelength range are used for the organic photoelectric conversion layer, and an imaging device in which a photoelectric conversion material that absorbs light of a specific wavelength range and a matrix material that is transparent to light of a wavelength range wider than the specific wavelength range are used for the organic photoelectric conversion layer, have been studied. Further, a mixed film using two kinds of high-molecular materials has been formed, and a report relating to electroluminescent characteristics, photoelectric conversion efficiency, and charge transport characteristics of copolymer has been made.

In all studies, however, there is no material that achieves both of high wavelength selectivity and high response speed. In the case where the organic photoelectric conversion layer is formed of the quinacridone derivative (low-molecular material) and the compound (low-molecular material) that does not absorb light of a specific wavelength range, the wavelength selectivity is excellent but high response speed is not obtainable. Moreover, in the case where the organic photoelectric conversion layer is formed of the two kinds of high-molecular materials, the high response speed is obtainable but the light absorption wavelength is broadened, which deteriorates the wavelength selectivity.

Therefore, in the present embodiment, as the material of the organic photoelectric conversion layer 17 provided between the lower electrode 15a and the upper electrode 18, the high-molecular semiconductor material that has the absorption coefficient in the visible light region of 50000 $cm^{-1}$ or less and the low-molecular material that has the absorption peak in the wavelength range corresponding to one color of the visible light region are used. As a result, a continuous carrier path is formed in the organic photoelectric conversion layer 17, and sensitivity with respect to the light of the specific wavelength range is improved.

As described above, in the present embodiment, the organic photoelectric conversion layer 17 provided between the lower electrode 15a and the upper electrode 18 is formed with use of the high-molecular semiconductor material that has the absorption coefficient in the visible light region of 50000 $cm^{-1}$ or less and the low-molecular material that has an absorption peak in the wavelength range corresponding to one color of the visible light region. As a result, a continuous carrier path is formed in the organic photoelectric conversion layer 17, and sensitivity with respect to the light of the specific wavelength range is improved. This makes it possible to improve response speed and wavelength selectivity.

2. MODIFICATION EXAMPLE

FIG. 10 illustrates a cross-sectional configuration of a photoelectric conversion element (photoelectric conversion element 30) according to a modification example of the disclosure. The photoelectric conversion element 30 configures, for example, one pixel (e.g., pixel P in FIG. 11 described later) in an imaging unit (e.g., imaging device 1 in FIG. 11 described later) such as a CCD image sensor and a CMOS image sensor. The photoelectric conversion element 30 includes a red photoelectric converter 30R, a green photoelectric converter 30G, and a blue photoelectric converter 30B in this order on the semiconductor substrate 11 with an insulation layer 42 in between.

In the photoelectric conversion element 30 according to the present modification example, each photoelectric converter 30R (30G or 30B) includes a photoelectric conversion layer 32R (32G or 31G) between a pair of electrodes, a first electrode 31R (31G or 31B) and a second electrode 33R (33G or 33B), and the photoelectric conversion layer 32R (32G or 31B) contains a transparent high-molecular semiconductor material and a low-molecular material excellent in wavelength selectivity.

[2-1. Basic Configuration]

As described above, the photoelectric conversion element 30 has a configuration in which the red photoelectric converter 30R, the green photoelectric converter 30G, and the blue photoelectric converter 30B are stacked in this order on a silicon substrate 41 with the insulation layer 42 in between. An on-chip lens 63 is provided on the blue photoelectric converter 30B with a protection layer 61 and a planarization layer 62 in between. A red charge accumulation layer 210R, a green charge accumulation layer 210G, and a blue charge accumulation layer 210B are provided in the silicon substrate 41. Light entering the on-chip lens 63 is photoelectrically converted by the red photoelectric converter 30R, the green photoelectric converter 30G, and the blue photoelectric converter 30B, and signal charges are transmitted from the red photoelectric converter 30R to the red charge accumulation layer 210R, from the green photoelectric converter 30G to the green charge accumulation layer 210G, and from the blue photoelectric converter 30B to the blue charge accumulation layer 210B. The signal charges may be electrons or holes generated through photoelectric conversion. In the following, a case where the electrons are read out as the signal charges is described as an example.

The silicon substrate 41 includes, for example, a p-type silicon substrate. The red charge accumulation layer 210R, the green charge accumulation layer 210G, and the blue charge accumulation layer 210B provided in the silicon substrate 41 each include an n-type semiconductor region. The electrons (signal charges) supplied from the red photoelectric converter 30R, the green photoelectric converter 30G, and the blue photoelectric converter 30B are accumulated in the respective n-type semiconductor regions. The n-type semiconductor region of each of the red charge accumulation layer 210R, the green charge accumulation layer 210G, and the blue charge accumulation layer 210B is formed by, for example, doping the silicon substrate 41 with an n-type impurity such as phosphorous (P) and arsenic (As). Note that the silicon substrate 41 may be provided on a supporting substrate (not illustrated) including, for example, glass.

Pixel transistors that read out the electrons from each of the red charge accumulation layer 210R, the green charge accumulation layer 210G, and the blue charge accumulation layer 210B to transfer the electrons to, for example, vertical signal lines (vertical signal lines Lsig in FIG. 11 described later) are provided in the silicon substrate 41. Floating diffusions of the respective pixel transistors are provided in the silicon substrate 41, and the respective floating diffusions are coupled to the red charge accumulation layer 210R, the green charge accumulation layer 210G, and the blue charge accumulation layer 210B. Each of the floating diffusions includes the n-type semiconductor region.

The insulation film 42 includes, for example, silicon oxide ($SiO_2$), silicon nitride (SiN), silicon oxynitride (SiON), or hafnium oxide ($HfO_2$). A plurality of kinds of insulation films may be stacked to configure the insulation film 42. The insulation layer 42 may include an organic insulation material. The insulation layer 42 includes electrodes and plugs that couple the red charge accumulation layer 210R and the red photoelectric converter 30R to each other, couple the green charge accumulation layer 210G and the green photoelectric converter 30G to each other, and couple the blue charge accumulation layer 210B and the blue photoelectric converter 30B to each other.

The red photoelectric converter 30R includes the first electrode 31R, the photoelectric conversion layer 32R, and the second electrode 33R in this order from a position close to the silicon substrate 41. The green photoelectric converter 30G includes the first electrode 31G, the photoelectric conversion layer 32G, and the second electrode 33G in this order from a position close to the red photoelectric converter 30R. The blue photoelectric converter 30B includes the first electrode 31B, the photoelectric conversion layer 32B, and the second electrode 33B in this order from a position close to the green photoelectric converter 30G. An insulation layer 34 is provided between the red photoelectric converter 30R and the green photoelectric converter 30G, and an insulation layer 35 is provided between the green photoelectric converter 30G and the blue photoelectric converter 30B. Light of red color (e.g., wavelength of 560 nm to 780 nm) is selectively absorbed by the red photoelectric converter 30R, light of green color (e.g., wavelength of 450 nm to 620 nm) is selectively absorbed by the green photoelectric converter 30G, light of blue color (e.g., wavelength of 400 nm to 560 nm) is selectively absorbed by the blue photoelectric converter 30B, and the electron-hole pairs are generated.

The first electrode 31R extracts the signal charges (charges) generated in the photoelectric conversion layer 32R, the first electrode 31G extracts the signal charges generated in the photoelectric conversion layer 32G, and the first electrode 31B extracts the signal charges generated in the photoelectric conversion layer 32B. The first electrodes 31R, 31G, and 31B are provided, for example, for each pixel. The first electrodes 31R, 31G, and 31B each include, for example, a light transmissive electroconductive material, specifically, ITO (Indium-Tin-Oxide). The first electrodes 31R, 31G, and 31B each may include, for example, a tin oxide ($SnO_2$) material or a zinc oxide (ZnO) material. The tin oxide material is obtained by adding a dopant to tin oxide. Examples of the zinc oxide material include aluminum zinc oxide (AZO) that is zinc oxide added with aluminum (Al) as a dopant, gallium zinc oxide (GZO) that is zinc oxide added with gallium (Ga) as a dopant, and indium zinc oxide (IZO) that is zinc oxide added with indium (In) as a dopant. In addition, for example, IGZO, CuI, $InSbO_4$, ZnMgO, $CuInO_2$, $MgIn_2O_4$, CdO, and $ZnSnO_3$ may be used. Each of the first electrodes 31R, 31G, and 31B has a thickness (thickness in stacking direction, hereinafter, simply referred to as thickness) of, for example, 50 nm to 500 nm.

For example, electron transport layers 32AR, 32AG, and 32AB are respectively provided between the first electrode 31R and the photoelectric conversion layer 32R, between the first electrode 31G and the photoelectric conversion layer 32G, and between the first electrode 31B and the photoelectric conversion layer 32B, as illustrated in FIG. 2. Note that, in FIG. 2, the red photoelectric converter 30R is illustrated as an example, however, each of the green photoelectric converter 30G and the blue photoelectric converter 30B has a similar configuration. The electron transport layers 32AR, 32AG, and 32AB respectively promote supply of the electrons generated in the photoelectric conversion layers 32R, 32G, and 32B to the first electrodes 31R, 31G, and 31B, and each include, for example, titanium oxide ($TiO_2$) or zinc oxide (ZnO). The electron transport layer may be configured by stacking titanium oxide and zinc oxide. The electron transport layer has a thickness of, for example, 0.1 nm to 1000 nm, and preferably 0.5 nm to 300 nm.

Each of the photoelectric conversion layers 32R, 32G, and 32B absorbs light of a selective wavelength range to perform photoelectric conversion, and allows light of the other wavelength range to pass therethrough. Each of the photoelectric conversion layers 32R, 32G, and 32B is a p-type semiconductor or an n-type semiconductor, and one of the p-type semiconductor and the n-type semiconductor preferably includes the transparent material, and the other preferably includes the material that photoelectrically converts light of the selective wavelength range, as with the above-described embodiment. In this case, for example, the transparent material has an absorption coefficient in the visible light region of 50000 $cm^{-1}$ or less, and is, for example, a high-molecular semiconductor material. For example, the selective wavelength is a wavelength range from 560 nm to 780 nm (more preferably, 600 nm or more and less than 750 nm) in the photoelectric conversion layer 32R, is a wavelength range from 480 nm to 620 nm (more preferably, 500 nm or more and less than 600 nm) in the photoelectric conversion layer 32G, and is a wavelength range from 430 nm to 540 nm (more preferably, 450 nm or more and less than 500 nm) in the photoelectric conversion layer 32B. The respective photoelectric conversion layers 21R, 32G, and 32B photoelectrically convert light corresponding to a portion of or entire corresponding wavelength ranges. The materials that configure the respective photoelectric conversion layers 32R, 32G, and 32B and photoelectrically convert light of the corresponding selective wavelength ranges are preferably low-molecular materials each having the absorption peak in the above-described corresponding wavelength ranges.

Examples of the p-type high-molecular semiconductor material include the compound (fluorene derivative or triphenylamine derivative) represented in the general formula (1) or (2) described in the above-described embodiment. Specifically, for example, the compounds represented in the formulae (1-1), (2-1), (2-2), (3-1), and (3-2) are exemplified. Further, for example, the compound represented in the formula (3-3) may be used. Examples of the n-type high-molecular semiconductor material include the compound (naphthalenediimide derivative) represented in the general formula (4) described in the above-described embodiment. As a specific example, the compound represented in the formula (4) is exemplified.

The low-molecular material configuring the photoelectric conversion layer 32R has an absorption coefficient α ($cm^{-1}$) of 50000 or more in the wavelength range from 560 nm to 780 nm (more preferably 600 nm or more and less than 750 nm). In the case where the n-type semiconductor is used as the low-molecular material, for example, phthalocyanine represented in the following general formula (10) and a derivative thereof (e.g., formulae (10-1 to 10-3)) may be used. The phthalocyanine derivative functions as a p-type semiconductor depending on a material to be combined. Examples of the p-type semiconductor include squarylium and a derivative thereof (e.g., formula (11-1)), in addition to the phthalocyanine derivative. Note that, in the phthalocyanine derivative functions as the n-type semiconductor, in particular, Z1 to Z16 in the following general formula (10) are preferably each independently a fluorine atom, a chlorine atom, a straight chain, branched, or cyclic perfluoroalkyl group, or a perfluorophenyl group. Moreover, many of squarylium and the derivative thereof function as the p-type semiconductor but also function as the n-type semiconductor depending on a material to be combined.

[Chemical Formula 15]

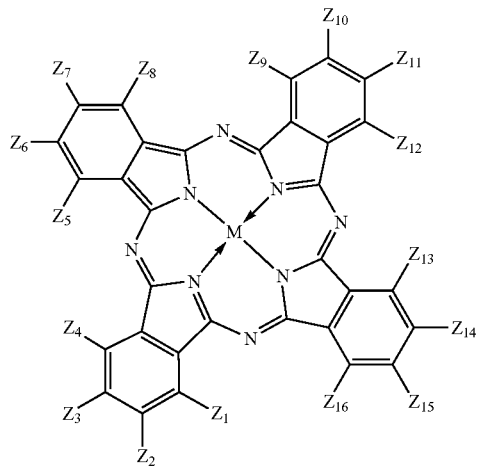

(10)

(Z1 to Z16 are each a hydrogen atom, a halogen atom, a straight chain, branched, or cyclic alkyl group, a phenyl group, a group containing a straight chain or ring-fused aromatic compound, a group containing a halide, a silylalkyl group, a silylalkoxy group, an aryl silyl group, an arylsulfanyl group, an alkylsulfanyl group, an arylsulfonyl group, an alkylsulfonyl group, an aryl sulfide group, an alkyl sulfide group, an amino group, an alkyl amino group, an aryl amino group, a hydroxy group, an alkoxy group, an acylamino group, an acyloxy group, a carbonyl group, a carboxy group, a carboxamido group, a carboalkoxy group, an acyl group, a sulfonyl group, a group containing chalcogenide, a phosphine group, a phosphon group, or a derivative thereof. M is a metal atom of Mg, Al, Si, Ca, Sc, Ti, V, Cr, Mn, Fe, Co, Ni, Cu, Zn, Ga, Ge, As, Y, Zr, Nb, Mo, Tc, Ru, Rh, Pd, Ag, Cd, In, Sn, Sb, Ba, Hf, Ta, W, Re, Os, Ir, Pt, Au, Hg, Tl, or Pb, or two hydrogen atoms.)

[Chemical Formula 16]

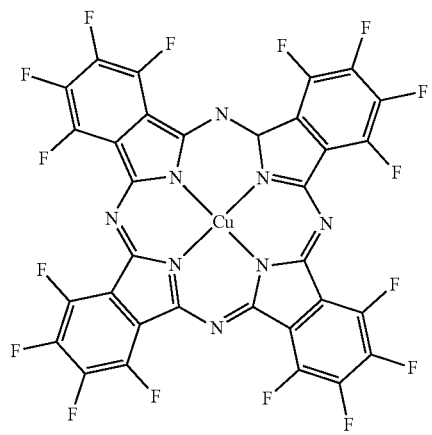

(10-1)

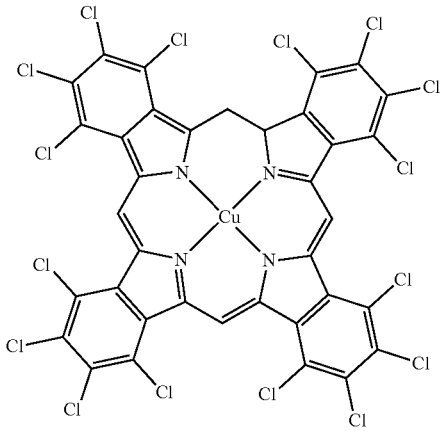

(10-2)

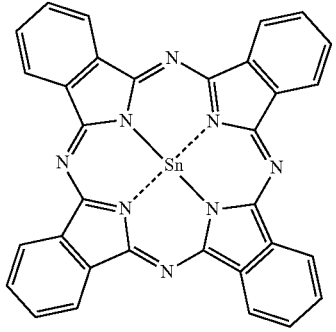

(10-3)

[Chemical Formula 17]

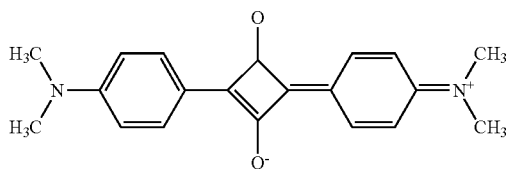

(11-1)

The low-molecular material configuring the photoelectric conversion layer 32G has an absorption coefficient α ($cm^{-1}$) of 50000 or more in the wavelength range from 480 nm to 620 nm (more preferably, 500 nm or more and less than 600 nm). In the case where the n-type semiconductor is used as the low-molecular material, for example, the subphthalocyanine derivative represented in the above-described general formula (5) and perylene bisimide represented in the above-described general formula (6) and the derivative thereof may be used. Specific examples of the foregoing compounds include the formulae (5-1) and (5-2), and the formulae (6-1) and (6-2). In addition, the compounds represented in the formulae (7-1) to (7-3) are exemplified. Examples of the p-type low-molecular material include quinacridone (QD) (formula (8-1)) and the derivative thereof (formula (8-2)), and boron-dipyrromethene (BODIPY) (formula (9-1)) and the derivative thereof (formula (9-2)). Note that subphthalocyanine and the derivative thereof (formula (5-1) described above) function as the p-type semiconductor depending on a material to be combined.

The low-molecular material configuring the photoelectric conversion layer 32B has an absorption coefficient α ($cm^{-1}$) of 50000 or more in the wavelength range from 430 nm to 540 nm (more preferably, 450 nm or more and less than 500 nm). In the case where the n-type semiconductor is used as the low-molecular material, for example, oligothiophene represented in the following general formula (12) and a derivative thereof (e.g., formulae (12-1) and (12-2)) are exemplified. The oligothiophene derivative also functions as the p-type semiconductor depending on a material to be combined. Examples of the p-type semiconductor include dinaphtho[2,3-b:2',3'-f]thieno[3,2-b]thiophene (DNTT) (formula (13)), in addition to the oligothiophene derivative.

[Chemical Formula 18]

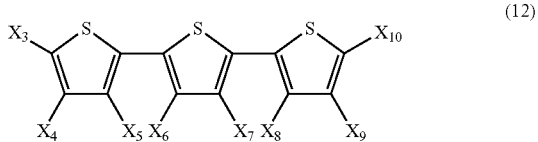

(12)

(X3 to X11 are each independently a hydrogen atom, a halogen atom, an alkyl group, a fluoroalkyl group, a phenyl group, a fluorophenyl group, a chlorophenyl group, a nitro group, a cyano group, or a derivative thereof. n is an integer of 1 to 10.)

[Chemical Formula 19]

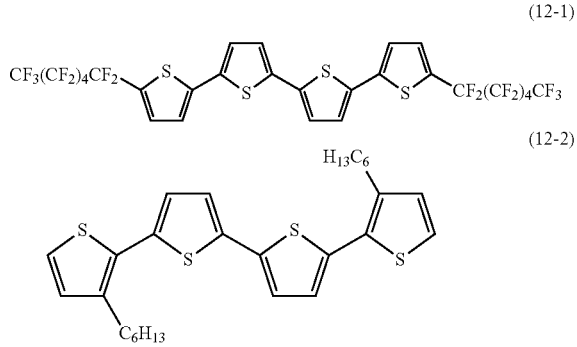

(12-1)

(12-2)

[Chemical Formula 20]

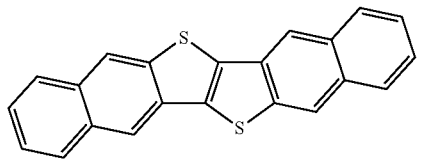

(13)

Each of the photoelectric conversion layers 32R, 32G, and 32B preferably includes both of the p-type semiconductor and the n-type semiconductor. For example, in the case where the p-type semiconductor is used as the high-molecular semiconductor material, the n-type semiconductor is preferably used for the low-molecular material. In the case where the n-type semiconductor is used as the high-molecular semiconductor material, the p-type semiconductor is preferably used for the low-molecular material. Further, a plurality of kinds of materials may be combined and used. Each of the photoelectric conversion layers 32R, 32G, and 32B has a thickness of, for example, 0.05 μm to 10 μm. The photoelectric conversion layers 32R, 32G, and 32B have the similar configuration except that the wavelength ranges of the absorbed light are different from one another.

For example, hole transport layers BR, 32BG, and 32BB are respectively provided between the photoelectric conversion layer 32R and the second electrode 33R, between the photoelectric conversion layer 32G and the second electrode 33G, and between the photoelectric conversion layer 32B and the second electrode 33B. The hole transport layers 32BR, 32BG, and 32BB respectively promote supply of the holes generated in the photoelectric conversion layers 32R, 32G, and 32B to the second electrodes 33R, 33G, and 33B, and each include, for example, molybdenum oxide ($MoO_3$), nickel oxide (NiO), or vanadium oxide ($V_2O_5$). Each of the hole transport layers may include organic materials such as PEDOT (Poly(3,4-ethylenedioxythiophene)) and TPD (N,N'-Bis(3-methylphenyl)-N,N'-diphenylbenzidine). Each of the hole transport layers BR, 32BG, and 32BB has a thickness of, for example, 0.5 nm to 100 nm.

The second electrode 33R extracts the holes generated in the photoelectric conversion layer 32R, the second electrode 33G extracts the holes generated in the photoelectric conversion layer 32G, and the second electrode 33B extracts the holes generated in the photoelectric conversion layer 32G. The holes extracted by the second electrodes 33R, 33G, and 33B are discharged to, for example, the p-type semiconductor regions (not illustrated) in the silicon substrate 41 through the respective transmission paths (not illustrated). Each of the second electrodes 33R, 33G, and 33B includes, for example, an electroconductive material such as gold (Au), silver (Ag), copper (Cu), and aluminum (Al). Each of the second electrodes 33R, 33G, and 33B may include the transparent electroconductive material, as with the first electrodes 31R, 31G, and 31B. In the photoelectric conversion element 30, the holes extracted by the second electrodes 33R, 33G, and 33B are discharged. Therefore, when a plurality of photoelectric conversion elements 30 are disposed (e.g., imaging unit 1 in FIG. 11 described later), the second electrodes 33R, 33G, and 33B may be provided in common to the photoelectric conversion elements 30 (pixel P in FIG. 30). Each of the second electrodes 33R, 33G, and 33B has a thickness of, for example, 0.5 nm to 100 nm.

The insulation layer 34 insulates the second electrode 33R and the first electrode 31G from each other, and the insulation layer 35 insulates the second electrode 33G and the first electrode 31B from each other. Each of the insulation layers 34 and 35 includes, for example, a metal oxide, a metal sulfide, or an organic matter. Examples of the metal oxide include silicon oxide ($SiO_2$), aluminum oxide ($Al_2O_3$), zirconium oxide ($ZrO_2$), titanium oxide ($TiO_2$), zinc oxide (ZnO), tungsten oxide ($WO_3$), magnesium oxide (MgO), niobium oxide ($Nb_2O_3$), tin oxide ($SnO_2$), and gallium oxide ($Ga_2O_3$). Examples of the metal sulfide include zinc sulfide (ZnS) and magnesium sulfide (MgS). A band gap of the material of each of the insulation layers 34 and 35 is preferably 3.0 eV or more. Each of the insulation layers 34 and 35 has a thickness of, for example, 2 nm to 100 nm.

The protection layer 61 covering the second electrode 33B prevents moisture, etc. from entering the red photoelectric converter 30R, the green photoelectric converter 30G, and the blue photoelectric converter 30B. The protection layer 61 includes a material having light transparency. For example, a single layer film including silicon nitride, silicon oxide, and silicon oxynitride, or a multilayer film thereof is used for such a protection layer 61.

The on-chip lens 63 is provided on the protection layer 61 with the planarization layer 62 in between. For example, an acrylic resin material, a styrene resin material, or an epoxy resin material may be used for the planarization layer 62. The planarization layer 62 may be provided as necessary, and the protection layer 61 may double as the planarization layer 62. The on-chip lens 63 condenses light entering from above on the light receiving surface of each of the red photoelectric converter 30R, the green photoelectric converter 30G, and the blue photoelectric converter 30B.

[2-2. Action and Effects]

As described above, in the present modification example, the photoelectric conversion layer 32R (32G and 21B) is formed with use of the high-molecular semiconductor material that has the absorption coefficient in the visible light region of 50000 cm$^{-1}$ or less and the low-molecular material that has the absorption peak in the wavelength range corresponding to one color in the visible light region. As a result, the continuous carrier path is formed in the photoelectric conversion layer 32R (32G and 21B) and sensitivity with respect to the light of the specific wavelength range is improved. This makes it possible to improve a response speed and wavelength selectivity.

3. APPLICATION EXAMPLES

Application Example 1

FIG. 11 illustrates an entire configuration of an imaging device (imaging device 1) in which the photoelectric conversion element 10 or 30 described in the above-described embodiment is used in each of pixels. The imaging device 1 is a CMOS image sensor. The imaging device 1 includes a pixel section 1a as an imaging area on the semiconductor substrate 11, and has a peripheral circuit section 130 that includes, for example, a row scanner 131, a horizontal selector 133, a column scanner 134, and a system controller 132, in a peripheral region of the pixel section 1a.

The pixel section 1a includes, for example, a plurality of unit pixels P (each corresponding to photoelectric conversion element 10) that are two-dimensionally arranged in a matrix. For example, in each of the unit pixels P, a pixel drive line Lread (specifically, row selection line and reset control line) is wired for each pixel row, and the vertical signal line Lsig is wired for each pixel column. The pixel drive line Lread transmits a drive signal to read a signal from the pixel. One end of the pixel drive line Lread is coupled to an output end of a corresponding row of the row scanner 131.

The row scanner 131 is a pixel driver that includes a shift register, an address decoder, etc., and drives the respective pixels P of the pixel section 1a, for example, on a row basis. A signal outputted from each of the pixels P of the pixel row selected and scanned by the row scanner 131 is supplied to the horizontal selector 133 through each of the vertical signal lines Lsig. The horizontal selector 133 includes, for example, an amplifier and a horizontal selection switch that are provided for each of the vertical signal lines Lsig.

The column scanner 134 includes, for example, a shift register and an address decoder, and sequentially drives the horizontal selection switches of the horizontal selector 133 while performing scanning. The signals of the respective pixels transmitted through the corresponding vertical signal lines Lsig are sequentially outputted to a horizontal signal line 135 through the selection scanning by the column scanner 134, and are transmitted to outside of the semiconductor substrate 11 through the horizontal signal line 135.

The circuit section including the row scanner 131, the horizontal selector 133, the column scanner 134, and the horizontal signal line 135 may be provided directly on the semiconductor substrate 11, or may be disposed in an external control IC. Further, the circuit section may be provided on the other substrate coupled by a cable, etc.

The system controller 132 receives a clock provided from the outside of the semiconductor substrate 11, data instructing an operation mode, etc., and outputs data such as internal information of the imaging device 1. The system controller 132 further includes a timing generator that generates various kinds of timing signals, and performs driving control of the peripheral circuits such as the row scanner 131, the horizontal selector 133, and the column scanner 134 on the basis of the various kinds of timing signals generated by the timing generator.

Application Example 2

The above-described imaging device 1 is applicable to, for example, various types of electronic apparatuses including an imaging function, for example, a camera system such as a digital still camera and a video camera, and a mobile phone including an imaging function. FIG. 14 illustrates a schematic configuration of an electronic apparatus 2 (camera) as an example. The electronic apparatus 2 is, for example, a video camera that captures a still image or a moving image, and includes the imaging device 1, an optical system (optical lens) 310, a shutter device 311, a driver 313 that drives the imaging device 1 and the shutter device 311, and a signal processor 312.

The optical system 310 guides image light (entering light) from an object, to the pixel section 1a of the imaging device 1. The optical system 310 may include a plurality of optical lenses. The shutter device 311 controls a light irradiation period and a light shielding period for the imaging device 1. The driver 313 controls transfer operation of the imaging device 1 and shutter operation of the shutter device 311. The signal processor 312 performs various kinds of signal processing on the signals outputted from the imaging device 1. A picture signal Dout subjected to the signal processing is stored in a storage medium such as a memory or outputted to a monitor, etc.

4. EXAMPLES

Next, Examples of the technology are described in detail.

Example 1

First, TFB (formula (3-1), available from LUMTEC) as the p-type high-molecular semiconductor and $F_6$-SubPc-OC$_6$F$_5$ (formula (5-2)) as the n-type low-molecular material were weighed at a weight ratio of 1:1, and the materials were dissolved in a chlorobenzene solution at a concentration of 20 mg/ml in total to prepare ink A. Subsequently, a glass substrate including an ITO electrode as the lower electrode was washed by UV/ozone treatment, and the ink A was applied to the glass substrate with use of a spin coating method. Next, the glass substrate was heated at 140° C. for 10 minutes by a hot plate to form a photoelectric conversion layer having a thickness of about 100 nm. Subsequently, an inside of a vacuum evaporation apparatus was reduced in pressure to 1×10$^{-5}$ Pa or less after the glass substrate was put in the vacuum evaporation apparatus, and a multilayer film of LiF (0.5 nm)/AlSiCu alloy (100 nm) was formed as the upper electrode through evaporation film formation, to fabricate a photoelectric conversion element (Example 1) having a photoelectric conversion region of 1 mm×1 mm.

Example 2

A photoelectric conversion element (Example 2) was fabricated with use of a method similar to the method of Example 1 except that only TFB (formula (3-1), available from LUMTEC) as the p-type high-molecular semiconductor was used and dissolved in the chlorobenzene solution at a concentration of 20 mg/ml to prepare ink B for formation of a photoelectric conversion layer.

Example 3

First, a glass substrate including an ITO electrode as the lower electrode was washed by UV/ozone treatment. An inside of a vacuum evaporation apparatus was reduced in pressure to $1\times10^{-5}$ Pa or less after the glass substrate was placed in the vacuum evaporation apparatus. Co-evaporation was performed with use of quinacridone (QD; (formula (8-1)), available from Tokyo Chemical Industry Co., Ltd.) as the p-type high-molecular semiconductor and SubPcCl (formula (5-1)) as the n-type low-molecular material, at an evaporation rate causing a volume ratio of 1:1, to form a photoelectric conversion layer having a thickness of about 100 nm. Subsequently, as with Example 1, a multilayer film of LiF (0.5 nm)/AlSiCu alloy (100 nm) was formed as the upper electrode through evaporation film formation, to fabricate a photoelectric conversion element (Example 3) having a photoelectric conversion region of 1 mm×1 mm.

Example 4

A photoelectric conversion element (Example 4) was fabricated with use of a method similar to the method of Example 3 except that 2-TNATA (formula (14), available from Sigma-Aldrich Co. LLC.) was used as the p-type high-molecular semiconductor.

[Chemical Formula 21]

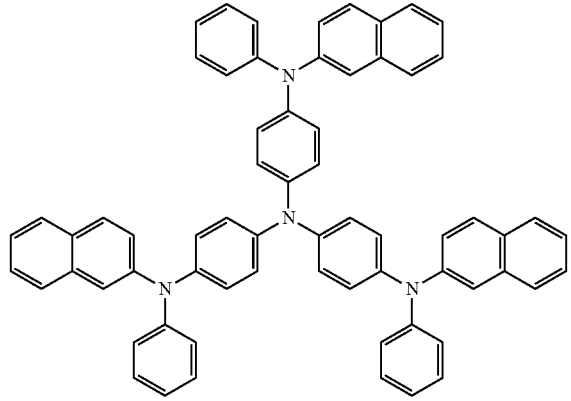

(14)

Example 5

A photoelectric conversion element (Example 5) was fabricated with use of a method similar to the method of Example 1 except that P3HT (formula (12-1), available from Rieke (R) Metals, Inc.) as the p-type high-molecular semiconductor and [6,6]-Phenyl-$C_{61}$-Butyric Acid Methyl Ester (PCBM; formula (15), available from American Dye Source, Inc.) as the n-type low-molecular material were weighed at a weight ratio of 1:1, and the materials were dissolved in a chlorobenzene solution at a concentration of 20 mg/ml in total to prepare ink C for formation of a photoelectric conversion layer.

[Chemical Formula 22]

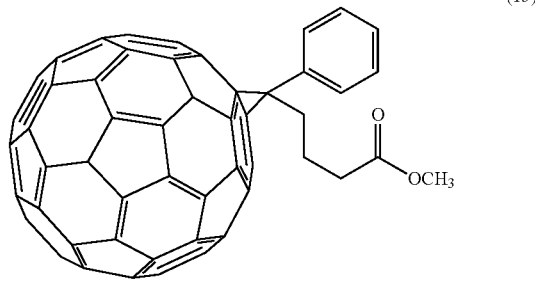

(15)

Example 6

A photoelectric conversion element (Example 6) was fabricated with use of a method similar to the method of Example 1 except that polymer including naphthalenediimide skeleton (PNDI (formula (4-1))) as the n-type high-molecular semiconductor and Boc-QD (formula (16)) as the p-type low-molecular material were weighed at a weight ratio of 1:1, the materials were dissolved in a chlorobenzene solution at a concentration of 20 mg/ml in total to prepare ink D for formation of a photoelectric conversion layer, and heating condition after application was set to heating at 160° C. for 5 minutes. Note that Boc-QD finally becomes QD because Boc group serving as a protective group was removed by the heating after application.

[Chemical Formula 23]

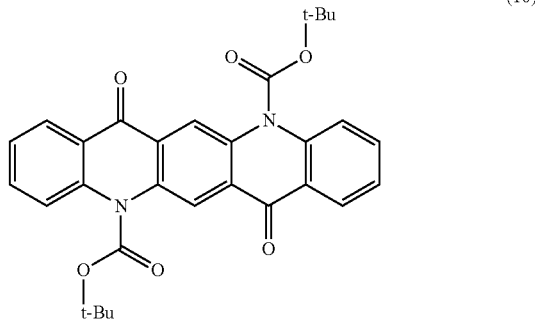

(16)

Example 7

A photoelectric conversion element (Example 7) was fabricated with use of a method similar to the method of Example 1 except that, instead of Boc-QD as the p-type low-molecular material in Example 6, P3HT (formula (12-1)) as the p-type high-molecular semiconductor was used and weighed at a weight ratio of 1:1, and the materials were dissolved in a chlorobenzene solution at a concentration of 20 mg/ml to prepare ink E.

In Examples 1 to 7 described above, variation of photocurrent with time when light irradiation was shielded by a shutter was measured with use of a semiconductor parameter analyzer to evaluate a response speed of the photoelectric conversion element when light was on or off. Specifically, a wavelength of the light that was applied from a light source to the photoelectric conversion element through a filter was set to 565 nm, a light quantity was set to 1.62 µW/cm², short-circuit was caused between electrodes of the photoelectric conversion element, a time necessary to attenuate a stationary photocurrent value in light irradiation to 3% after the light was shielded was defined as 3% attenuating time, and the response speed was evaluated. In addition, the wavelength selectivity of light absorption spectrum of the photoelectric conversion film was evaluated with use of an ultraviolet visible light spectrophotometer. The following expression 1 was used as an index of the wavelength selectivity. Note that Abs. [nm] is an absorption coefficient of the wavelength, and Y is a value indicating the wavelength selectivity of a green range. When the wavelength selectivity is high, the value Y becomes close to 1, and when the wavelength selectivity is absent, the value Y becomes 0.33. Table 1 summarizes the response speed indices (3% attenuating time) and the wavelength selectivity indices (Y) in Examples 1 to 5.

[Numerical Expression 1]

$$Y=\text{Abs. [546 nm]}/(\text{Abs. [470 nm]}+\text{Abs. [546 nm]}+\text{Abs. [700 nm]}) \quad (1)$$

TABLE 1

| | p-type semiconductor | n-type semiconductor | Response speed index | Wavelength selectivity index |
|---|---|---|---|---|
| Example 1 | Formula (3-1) | Formula (5-2) | 50 ms | 0.85 |
| Example 2 | Formula (3-1) | — | N.A. | 0.34 |
| Example 3 | Formula (8-1) | Formula (5-1) | >300 ms | 0.81 |
| Example 4 | Formula (14) | Formula (5-1) | >300 ms | 0.84 |
| Example 5 | Formula (12-1) | Formula (15) | 20 ms | 0.49 |
| Example 6 | Formula (16) | Formula (4-1) | 100 ms | 0.75 |
| Example 7 | Formula (12-1) | Formula (4-1) | 100 ms | 0.51 |

In Example 1, the 3% attenuating time as the response speed index was 50 ms and the wavelength selectivity index Y was 0.85. In contrast, in Example 2, the 3% attenuating time as the response speed index was not measurable, the wavelength selectivity was substantially absent, and the wavelength selectivity index Y was low as 0.34. It is considered that this was because the photoelectric conversion layer in Example 2 did not include the material having absorption in the green region. Further, in Example 3 and Example 4, the wavelength selectivity index Y was high as 0.81 and 0.84, but the 3% attenuating time as the response speed index was long as 300 ms or more. In Example 5, the 3% attenuating time was short as 20 ms but the wavelength selectivity index Y was low as 0.49. In Example 6, the 3% attenuating time as the response speed index was 100 ms and the wavelength selectivity index Y was 0.75. In contrast, in Example 7, the 3% attenuating time as the response speed index was 100 ms as with Example 6 but the wavelength selectivity index Y was low as 0.51. It is considered that this was because the photoelectric conversion layer in Example 7 did not include a material having steep absorption in the green region.

As is known from Table 1, in Example 1 in which the n-type low-molecular material and the p-type high-molecular semiconductor were combined, the 3% attenuating time as the response speed index indicated the relatively high response as 50 ms, and the wavelength selectivity index Y indicated relatively high value as 0.85. It is considered that, in Example 1, a continuous carrier path was formed in the photoelectric conversion layer and responsiveness at high speed was achieved because the transparent p-type high-molecular semiconductor TFB was used for the photoelectric conversion layer. Further, it is considered that the selective wavelength sensitivity was achieved owing to use of the low-molecular material $F_6$-SubPc-OC$_6$F$_5$ excellent in wavelength selectivity of the green region. Further, in Example 6 in which the p-type low-molecular material and the n-type high-molecular semiconductor were combined, the 3% attenuating time as the response speed index indicated relatively high response as 100 ms, and the wavelength selectivity index Y indicated a relatively high value as 0.75. It is considered that, in Example 6, the continuous carrier path was formed in the photoelectric conversion layer and responsiveness at high speed was achieved because the transparent n-type high-molecular semiconductor PNDI was used for the photoelectric conversion layer. Further, it is considered that selective wavelength sensitivity was achieved owing to use of the low-molecular material Boc-QD excellent in wavelength selectivity of the green region.

Although the technology has been described with reference to the embodiment and the modification example, the disclosed contents are not limited to the above-described embodiment, etc. and may be variously modified. For example, in the above-described embodiment, the photoelectric conversion element has the configuration in which the organic photoelectric converter 11G detecting the green light and the inorganic photoelectric converters 11B and 11R respectively detecting the blue light and the red light are stacked; however, the disclosed contents are not limited to such a structure. In other words, the organic photoelectric converter may detect the red light or the blue light, or the inorganic photoelectric converter may detect the green light.

Further, the number of organic photoelectric converter and inorganic photoelectric converter and the ratio thereof are not limited. Two or more organic photoelectric converters may be provided, or color signals of a plurality of colors may be acquired only by the organic photoelectric converters. Moreover, the structure is not limited to the structure in which the organic photoelectric converter and the inorganic photoelectric converter are stacked in the vertical direction, and the organic photoelectric converter and the inorganic photoelectric converter may be disposed side by side along the substrate surface.

Furthermore, in the above-described embodiment, etc., the configuration of the rear-surface irradiation imaging device has been exemplified; however, the disclosed contents are applicable to a front-surface irradiation imaging device. In addition, it is unnecessary for the imaging device (photoelectric conversion element) of the disclosure to include all of the components described in the above-described embodiment, and the imaging device may further include other layers.

Note that the effects described in the present specification are illustrative and non-limiting, and other effects may be achieved.

Note that the present disclosure may include the following configurations.

(1)

A photoelectric conversion element, including:
a first electrode and a second electrode that are oppositely disposed; and
a photoelectric conversion layer that is provided between the first electrode and the second electrode, and includes a high-molecular semiconductor material and a low-molecular material, the high-molecular semiconductor material having an absorption coefficient in a visible light region of 50000 cm$^{-1}$ or less, the low-molecular material including an absorption peak in a wavelength range corresponding to one color in the visible light region.

(2)

The photoelectric conversion element according to (1), in which the high-molecular semiconductor material includes a p-type semiconductor, and the low-molecular material includes an n-type semiconductor.

(3)

The photoelectric conversion element according to (1) or (2), in which the high-molecular semiconductor material includes an n-type semiconductor, and the low-molecular material includes a p-type semiconductor.

(4)

The photoelectric conversion element according to any one of (1) to (3), in which the low-molecular material has an absorption coefficient of 50000 $cm^{-1}$ or more in a wavelength range of 450 nm or more and less than 500 nm, a wavelength range of 500 nm or more and less than 600 nm, or a wavelength range of 600 nm or more and less than 750 nm.

(5)

The photoelectric conversion element according to any one of (1) to (4), in which the high-molecular semiconductor material has a molecular weight of 3000 or more, and the low-molecular material has a molecular weight of less than 3000.

(6)

The photoelectric conversion element according to any one of (1) to (5), in which the visible light region is 450 nm or more and 750 nm or less.

(7)

An imaging device including one or a plurality of organic photoelectric converters in each of pixels, each of the organic photoelectric converters including:

a first electrode and a second electrode that are oppositely disposed; and a photoelectric conversion layer that is provided between the first electrode and the second electrode, and includes a high-molecular semiconductor material and a low-molecular material, the high-molecular semiconductor material having an absorption coefficient in a visible light region of 50000 $cm^{-1}$ or less, the low-molecular material including an absorption peak in a wavelength range corresponding to one color in the visible light region.

(8)

The imaging device according to (7), in which the one or the plurality of organic photoelectric converters and one or a plurality of inorganic photoelectric converters are stacked in each of the pixels, each of the inorganic photoelectric converters performing photoelectric conversion of a wavelength range different from a wavelength range of the organic photoelectric converters.

(9)

The imaging device according to (8) or (8), in which the inorganic photoelectric converters are embedded in a semiconductor substrate, and the organic photoelectric converters are provided on first surface side of the semiconductor substrate.

(10)

The imaging device according to (9), in which a multilayer wiring layer is provided on second surface side of the semiconductor substrate.

(11)

The imaging device according to (9) or (10), in which the organic photoelectric converters perform photoelectric conversion of green light, and the inorganic photoelectric converter performing photoelectric conversion of blue light and the inorganic photoelectric converter performing photoelectric conversion of red light are stacked in the semiconductor substrate.

(12)

The imaging device according to any one of (7) to (11), in which the plurality of organic photoelectric converters that perform photoelectric conversion of wavelength ranges different from one another are stacked in each of the pixels.

(13)

An electronic apparatus including an imaging device that includes one or a plurality of organic photoelectric converters in each of pixels, each of the organic photoelectric converters including:

a first electrode and a second electrode that are oppositely disposed; and a photoelectric conversion layer that is provided between the first electrode and the second electrode, and includes a high-molecular semiconductor material and a low-molecular material, the high-molecular semiconductor material having an absorption coefficient in a visible light region of 50000 $cm^{-1}$ or less, the low-molecular material including an absorption peak in a wavelength range corresponding to one color in the visible light region.

This application is based upon and claims the benefit of priority of the Japanese Patent Application No. 2015-168322 filed with the Japan Patent Office on Aug. 27, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photoelectric conversion element, comprising:
a first electrode and a second electrode opposite to the first electrode; and
a photoelectric conversion layer between the first electrode and the second electrode, wherein
the photoelectric conversion layer includes a high-molecular semiconductor material and a low-molecular material,
the high-molecular semiconductor material has a first absorption coefficient of 50000 $cm^{-1}$ or less in a visible light region,
the visible light region corresponds to a first wavelength range of 450 nm to 750 nm,
the high-molecular semiconductor material has a molecular weight of 3000 or more,
the low-molecular material has a second absorption coefficient of 50000 $cm^{-1}$ or more,
the low-molecular material has a molecular weight of less than 3000, and
the low-molecular material includes an absorption peak in a second wavelength range corresponding to one color in the visible light region.

2. The photoelectric conversion element according to claim 1, wherein
the high-molecular semiconductor material includes a p-type semiconductor, and
the low-molecular material includes an n-type semiconductor.

3. The photoelectric conversion element according to claim 1, wherein
the high-molecular semiconductor material includes an n-type semiconductor, and the low-molecular material includes a p-type semiconductor.

4. The photoelectric conversion element according to claim 1, wherein the low-molecular material has the second absorption coefficient of 50000 cm$^{-1}$ or more in one of a third wavelength range of 450 nm to 500 nm, a fourth wavelength range of 500 nm to 600 nm, or a fifth wavelength range of 600 nm to 750 nm.

5. An imaging device, comprising:
a plurality of pixels, wherein
each of the plurality of pixels includes a plurality of organic photoelectric converters, and
each of the plurality of organic photoelectric converters includes:
a first electrode and a second electrode opposite to the first electrode; and
a photoelectric conversion layer between the first electrode and the second electrode, wherein
the photoelectric conversion layer includes a high-molecular semiconductor material and a low-molecular material,
the high-molecular semiconductor material has a first absorption coefficient of 50000 cm$^{-1}$ or less in a visible light region,
the visible light region corresponds to a first wavelength range of 450 nm to 750 nm,
the high-molecular semiconductor material has a molecular weight of 3000 or more,
the low-molecular material has a second absorption coefficient of 50000 cm$^{-1}$ or more,
the low-molecular material has a molecular weight of less than 3000, and
the low-molecular material includes an absorption peak in a second wavelength range corresponding to one color in the visible light region.

6. The imaging device according to claim 5, wherein
each of the plurality of pixels includes a stack of the plurality of organic photoelectric converters and a plurality of inorganic photoelectric converters, and
each of the plurality of inorganic photoelectric converters is configured to photoelectrically convert a third wavelength range different from a fourth wavelength range associated with the plurality of organic photoelectric converters.

7. The imaging device according to claim 6, further comprising
a semiconductor substrate, wherein
the plurality of inorganic photoelectric converters is in the semiconductor substrate,
the semiconductor substrate includes a first surface side and a second surface side, and
the plurality of organic photoelectric converters is on the first surface side of the semiconductor substrate.

8. The imaging device according to claim 7, further comprising
a multilayer wiring layer on the second surface side of the semiconductor substrate, wherein the second surface side is opposite to the first surface side.

9. The imaging device according to claim 7, wherein
each of the plurality of organic photoelectric converters is configured to photoelectrically convert green light,
a first inorganic photoelectric converter of the plurality of inorganic photoelectric converters is configured to photoelectrically convert blue light, and
a second inorganic photoelectric converter of the plurality of inorganic photoelectric converters is configured to photoelectrically convert red light.

10. The imaging device according to claim 5, wherein
each of the plurality of pixels includes a stack of the plurality of organic photoelectric converters,
the plurality of organic photoelectric converters is configured to photoelectrically covert a plurality of wavelength ranges, and
each of the plurality of wavelength ranges is different.

11. An electronic apparatus, comprising:
an imaging device that includes a plurality of pixels, wherein
each of the plurality of pixels includes at least one organic photoelectric converter, and
the at least one organic photoelectric converter comprises:
a first electrode and a second electrode opposite to the first electrode; and
a photoelectric conversion layer between the first electrode and the second electrode, wherein
the photoelectric conversion layer includes a high-molecular semiconductor material and a low-molecular material,
the high-molecular semiconductor material has a first absorption coefficient of 50000 cm$^{-1}$ or less in a visible light region,
the visible light region corresponds to a first wavelength range of 450 nm to 750 nm,
the high-molecular semiconductor material has a molecular weight of 3000 or more,
the low-molecular material has a second absorption coefficient of 50000 cm$^{-1}$ or more,
the low-molecular material has a molecular weight of less than 3000, and
the low-molecular material includes an absorption peak in a second wavelength range corresponding to one color in the visible light region.

12. The photoelectric conversion element according to claim 1, wherein
one of the first electrode or the second electrode is an upper electrode, and
the upper electrode covers a top surface and side surfaces of the photoelectric conversion layer.

* * * * *